(12) United States Patent
Sorenson

(10) Patent No.: US 10,522,996 B2
(45) Date of Patent: Dec. 31, 2019

(54) ELECTRONIC CIRCUIT BREAKER WITH PHYSICAL OPEN-CONTACT CONSTRUCTION AND FAIL-SAFE PROTECTION

(71) Applicant: Richard W. Sorenson, Ft. Lauderdale, FL (US)

(72) Inventor: Richard W. Sorenson, Ft. Lauderdale, FL (US)

( * ) Notice: Subject to any disclaimer, the term of this patent is extended or adjusted under 35 U.S.C. 154(b) by 0 days.

(21) Appl. No.: 16/427,657

(22) Filed: May 31, 2019

(65) Prior Publication Data

US 2019/0326744 A1 Oct. 24, 2019

Related U.S. Application Data

(63) Continuation of application No. 16/113,534, filed on Aug. 27, 2018, now Pat. No. 10,340,678, which is a (Continued)

(51) Int. Cl.
*H02H 3/08* (2006.01)
*H02H 1/06* (2006.01)
*G01R 31/327* (2006.01)

(52) U.S. Cl.
CPC ............. *H02H 3/08* (2013.01); *G01R 31/327* (2013.01); *H02H 1/06* (2013.01)

(58) Field of Classification Search
CPC ........... G01R 31/327; H01H 2205/002; H01H 47/002; H01H 47/223; H01H 50/44;
(Continued)

(56) References Cited

U.S. PATENT DOCUMENTS 2,381,254 A * 8/1945 Benine ..................... H02H 3/24
361/92
4,105,965 A 8/1978 Russell
(Continued)

FOREIGN PATENT DOCUMENTS

WO WO1986002786 5/1986

OTHER PUBLICATIONS

Mesut Baran,"Collaborative Protection and Control Schemes for Shipboard Electrical Systems", Mar. 26, 2007. Office of Naval Research Regional Office, Atlanta, GA. Retrieved from the Internet: URL: https://apps.dtic.mil/dtic/tr/fulltext/u2/a465251.pdf(Year: 2007).*
(Continued)

*Primary Examiner* — Thienvu V Tran
*Assistant Examiner* — Nicolas Bellido
(74) *Attorney, Agent, or Firm* — Forge IP, PLLC

(57) ABSTRACT

A circuit breaker includes main contacts movable between closed and open positions such that a line terminal and a load terminal are, respectively, in electrical communication or electrically isolated. A trip coil is connected to the contacts, causing the contacts to move from the closed position to the open position in response to a trip current, thereby tripping the circuit breaker. A normally closed relay having a relay activating circuit and a switching circuit is provided, with the switching circuit being electrically connected to the trip coil. A monitoring circuit is electrically connected to the relay activating circuit, supplying activating power to the relay activating circuit so long as a determination is made that the breaker is operating within acceptable parameters, and ceasing to supply activating power to the relay activating circuit upon a determination being made that the breaker is not operating within acceptable parameters, thereby tripping the breaker.

13 Claims, 17 Drawing Sheets

Related U.S. Application Data continuation-in-part of application No. 15/959,882, filed on Apr. 23, 2018, now Pat. No. 10,290,448.

(58) Field of Classification Search
CPC .... H01H 50/56; H01H 71/123; H01H 71/128; H01H 71/2481; H01H 71/50; H01H 83/20; H02H 1/06; H02H 3/05; H02H 3/08; H02H 3/10

See application file for complete search history.

(56) References Cited

U.S. PATENT DOCUMENTS

| | | | |
|---|---|---|---|
| 4,266,259 A | | 5/1981 | Howell |
| 4,308,511 A | * | 12/1981 | Borona ................ H01H 89/06 307/38 |
| 4,331,999 A | | 5/1982 | Engel et al. |
| 4,338,647 A | | 7/1982 | Wilson et al. |
| 4,412,267 A | | 10/1983 | Hansen |
| 5,388,022 A | | 2/1995 | Ahuja |
| 5,886,860 A | | 3/1999 | Chen et al. |
| 6,157,529 A | | 12/2000 | Ahuja |
| 6,212,049 B1 | | 4/2001 | Spencer et al. |
| 6,671,144 B1 | | 12/2003 | Langford et al. |
| 6,831,819 B2 | | 12/2004 | Nemir et al. |
| 9,058,952 B2 | | 6/2015 | Liu |
| 10,290,448 B1 | * | 5/2019 | Sorenson ............. H01H 47/002 |
| 10,340,678 B1 | * | 7/2019 | Sorenson ................ H02H 1/06 |
| 2003/0193381 A1 | * | 10/2003 | Davidson ............... H01H 89/06 335/14 |
| 2009/0109589 A1 | | 4/2009 | Yoo et al. |

OTHER PUBLICATIONS

Emil Anthonsen Dyrstad, "Relay Lab at NTNU", Jun. 30, 2014, Master's thesis submitted to Norwegian University of Science and Technology. Retrieved from the Internet: URL: https://core.ac.uk/download/pdf/52105948.pdf (Year: 2014).*

Hataway, et al, "Improving Breaker Failure Protection for Generator Applications", Dec. 31, 2011, Power South Energy cooperative and Schweitzer Engineering Laboratories, Inc; ittps://www.eiseverywhere.com/file_uploads/c631dab5c47fc413290274a565d1cf67_tho2_pap.pdf.

* cited by examiner

ELECTRONIC CIRCUIT BREAKER WITH PHYSICAL OPEN-CONTACT CONSTRUCTION AND FAIL-SAFE PROTECTION

FIELD OF THE INVENTION

The present invention is directed to an electronically controlled circuit breaker that incorporates a mechanical contact mechanism while maximizing the fail-safe level of the breaker to insure its ability to provide the required circuit protection.

BACKGROUND OF THE INVENTION

Traditional alternating current (AC) circuit breakers employ electro-mechanical means to provide protection against current overload and inrush. Similarly, alternating current (AC) circuit breakers employing electronic circuits to detect and trip the breakers when ground faults and/or arc faults are detected also generally incorporate an electro-mechanical means to provide protection against current overload and inrush. In these circuit breakers the electronics generally do not provide monitoring or protective control of the breaker in regard to current overload or inrush. Thus, should the electronic circuitry protecting against ground fault and/or arc fault fail, the breaker will still maintain its protection against overload and excessive inrush current.

Ideally, such a circuit breaker would also be able to employ electronic circuitry, either solely or combined with ground-fault and/or arc fault protection, to monitor current overload and inrush current and thereby trip the breaker should either be excessive. The electronics therein would be able to be exactingly programmed to provide precise protection against overload and inrush current. The problem with only employing electronic circuitry to provide a breaker's protective capability has been that, should the electronic circuitry fail, the breaker could remain in an "on" (connected) status during an overload, resulting in a dangerous, unacceptable condition.

An electro-mechanical circuit breaker that employs either thermal bi-metal construction, or hydraulic-magnetic construction, to provide current overload and inrush protection, is not completely failure proof, but is designed to be as failure proof as possible. Thus, any design of an electronically controlled circuit breaker would necessitate a similar degree of failure proof construction as inherent within traditional electro-mechanical circuit breaker designs.

Safety becomes a major factor in any employment of AC electronic circuit breakers that rely totally on solid-state microprocessor controlled electronics to provide protection without the incorporation of a physical contact opening during a trip (i.e., off) state. Also, existing technology for circuit protection that solely employs solid-state microprocessor controlled electronics to switch high voltage AC power incurs high cost and significant heat dissipation problems. The most practical and safe approach is to combine microprocessor based electronics to monitor the desired circuit protection parameters with a mechanical contact mechanism that would provide a physical contact gap in the open (i.e., off) position.

Attempts have been made to provide AC electronic circuit breakers that rely totally on solid-state microprocessor controlled electronics to provide protection against current overload and inrush current in addition to ground-fault and/or arc fault protection. However, none of these attempts have resulted in a circuit breaker design that provides a similar degree of failure proof construction as inherent within traditional electro-mechanical circuit breaker designs.

For example, U.S. Pat. No. 4,331,999 to Engel et al. and U.S. Pat. No. 4,338,647 to Wilson et al. disclose circuit interrupters with a digital control unit (154) that causes tripping of a trip coil (22) in response to various sensed conditions. However, both references discuss the use of a switching field effect transistor (192) to control the flow of current through the trip coil (22) in response to signals from the digital control unit (154). As such, in the case of failure within the digital control unit (154) and/or the transistor (192), the transistor (192) may be stuck in the unenergized state, thereby rendering the trip coil (22) inoperative, resulting in a potentially dangerous condition.

As such, there remains an unmet need in the industry for an electronically controlled circuit breaker that incorporates a mechanical contact mechanism while maximizing the fail-safe level of the breaker to insure its ability to provide the required circuit protection.

SUMMARY OF THE INVENTION

In general terms, the present invention provides for an electronically programmable AC circuit breaker with a protection configuration to render the breaker inoperable should there be a failure in the electronic monitoring circuitry. The electronic circuit breaker employs a relay circuit, either electro-mechanical or solid state, in a configuration that would render the breaker inoperable should either the electronic protection circuitry, or the relay itself, fail.

The breaker employs a simple, inexpensive, magnetic coil solenoid device to activate the breaker's trip function, and incorporates an electronic control circuit that is programmed with the desired circuit breaker trip parameters, to include overload trip rating and, if provided, inrush current time delay. The electronic control circuitry may include additional protection capabilities such as ground fault and/or arc fault, as desired.

The breaker incorporates a normally closed relay with the breaker's trip coil connected to the output of the relay's normally closed (i.e., on) switching circuit. The power feed to the breaker is connected both to the breaker's main output circuit, and also to a switch internal to the breaker that will be turned to its closed (i.e., on) state as the breaker is actuated to provide power to the electronic control circuitry. This internal switch is actuated to its closed (i.e., on) state prior to the breaker's main output circuit being switched to its closed (i.e., on) state, and thus the electronic protection circuity is activated prior to the breaker providing power to its connected load.

This electronic breaker design is also appropriate for direct current (DC) circuit protection applications when a physical contact gap is desired, as may be for safety and/or heat concerns.

A specific exemplary embodiment of a circuit breaker according to the present invention includes a pair of main contacts movable with respect to each other between a closed position wherein a line terminal and a load terminal are in electrical communication with each other via a main power circuit, and an open position wherein the line terminal and the load terminal are electrically isolated from each other. A trip coil is connected to at least one of the pair of main contacts, the trip coil causing the pair of main contacts to move from the closed position to the open position in response to a trip current, thereby tripping the circuit breaker. The circuit breaker also includes a normally closed relay having a relay activating circuit and a switching circuit, the switching circuit defaulting to an on state, but being switchable to an off state when activating power is supplied to the activating circuit or coil, the switching circuit automatically returning to the on state when activating power to the relay activating circuit is interrupted.

The switching circuit of the normally closed relay is electrically connected to the trip coil, such that the switching circuit of the normally closed relay provides the trip current to the trip coil when the switching circuit is in the on state, thereby tripping the circuit breaker, but ceases to provide the trip current to the trip coil when the switching circuit is in the off state, thereby allowing the line terminal and the load terminal to be in electrical communication with each other. A monitoring circuit is electrically connected to the relay activating circuit of the normally closed relay, the monitoring circuit supplying activating power to the relay activating circuit so long as a determination is made that the circuit breaker is operating within acceptable parameters, and ceasing to supply activating power to the relay activating circuit upon a determination being made that the circuit breaker is not operating within acceptable parameters, thereby tripping the circuit breaker.

In some embodiments, the determination is made that the circuit breaker is not operating within acceptable parameters upon detection of at least one of the following: an inrush current above a threshold level and an overcurrent above a threshold level. In certain of these embodiments, the determination is made that the circuit breaker is not operating within acceptable parameters upon detection of at least one of the following: a ground fault condition and an arc fault condition.

In some embodiments, the monitoring circuit is also in direct electrical communication with the trip coil, and the monitoring circuit causes tripping of the trip coil in response to an overcurrent and/or fault condition. In some embodiments, a sensor is electrically disposed in the main power circuit and the monitoring circuit is in electrical communication the sensor.

In some embodiments, the normally closed relay comprises a solid state normally closed relay and the relay activating circuit comprises a solid state activating circuit. In other embodiments, the normally closed relay comprises an electro-mechanical normally closed relay and the relay activating circuit comprises an activating coil.

In some embodiments, the monitoring circuit receives power directly from a power supply supplying power to the line terminal, whereby whenever power is supplied to the line terminal, the monitoring circuit is powered on, and, when said monitoring circuit be operating properly, activating power is supplied to the relay activating circuit.

In some embodiments, the circuit breaker further includes an internal switch selectively supplying power to the monitoring circuit, the internal switch being switched to an on state prior to the main contacts being closed so as to allow the monitoring circuit to supply activating power to the relay activating circuit of the normally closed relay. In certain of these embodiments, the internal switch also selectively supplies power to the switching circuit of the normally closed relay.

In certain embodiments, the switching circuit of the normally closed relay receives power from the main power circuit, downstream of the pair of main contacts. In certain of these embodiments, the circuit breaker further includes a surge protector electrically connected between the pair of main contacts and the switching circuit of the normally closed relay. In other embodiments, the circuit breaker further includes a trip circuit switch electrically connected between the pair of main contacts and the switching circuit of the normally closed relay.

In certain of these embodiments, during switching of the circuit breaker from an off state to an on state, the internal switch is switched to an on state so as to allow the monitoring circuit to supply activating power to the relay activating circuit of the normally closed relay, then subsequently, the trip circuit switch is switched to an on state to supply power to the switching circuit of the normally closed relay, and then subsequently, the pair of main contacts are moved to their closed position.

In some embodiments, the pair of main contacts are moveable between their open and closed positions by movement of a contact arm, and the trip circuit switch comprises a leaf spring contact which contacts the contact arm and thereby provides power to the trip circuit just prior to the contact arm closing the pair of main contacts, thereby assuring that the trip current provided to the trip coil is instantaneous, as the trip current ends immediately as the circuit breaker is tripped. In certain of these embodiments, the leaf spring contact comprises a double leaf spring contact, and the double leaf spring contact further acts as the internal switch.

In accordance with another specific exemplary embodiment of the present invention, a circuit breaker includes a pair of main contacts movable with respect to each other between a closed position wherein a line terminal and a load terminal are in electrical communication with each other via a main power circuit, and an open position wherein the line terminal and the load terminal are electrically isolated from each other. A trip coil is connected to at least one of the pair of main contacts, the trip coil causing the pair of main contacts to move from the closed position to the open position in response to a trip current, thereby tripping the circuit breaker. The circuit breaker also includes a normally closed relay having a relay activating circuit and a switching circuit.

The switching circuit of the normally closed relay is electrically connected to the trip coil and the switching circuit of the normally closed relay receives power from the main power circuit, downstream of the pair of main contacts. A monitoring circuit is electrically connected to the relay activating circuit of the normally closed relay, the monitoring circuit supplying activating power to the relay activating circuit so long as a determination is made that the circuit breaker is operating within acceptable parameters, and ceasing to supply activating power to the relay activating circuit upon a determination being made that the circuit breaker is not operating within acceptable parameters, thereby tripping the circuit breaker.

A trip circuit switch is electrically connected between the pair of main contacts and the switching circuit of the normally closed relay. The pair of main contacts are moveable between their open and closed positions by movement of a contact arm, and the trip circuit switch comprises a leaf spring contact which contacts the contact arm and thereby provides power to the trip circuit just prior to the contact arm closing the pair of main contacts, thereby assuring that the trip current provided to the trip coil is instantaneous, as it ends immediately as the circuit breaker is tripped.

In accordance with another specific exemplary embodiment of the present invention, a circuit breaker includes a pair of main contacts movable with respect to each other between a closed position wherein a line terminal and a load terminal are in electrical communication with each other via a main power circuit, and an open position wherein the line terminal and the load terminal are electrically isolated from each other. A trip coil is connected to at least one of the pair of main contacts, the trip coil causing the pair of main contacts to move from the closed position to the open position in response to a trip current, thereby tripping the circuit breaker.

A normally closed relay has a relay activating circuit and a switching circuit, the switching circuit defaulting to an on state, but being switchable to an off state when activating power is supplied to the relay activating circuit, the switching circuit automatically returning to the on state when activating power to the relay activating circuit is interrupted.

An input of the switching circuit of the normally closed relay receives power from the main power circuit, downstream of the pair of main contacts, and an output of the switching circuit of the normally closed relay is electrically connected to the trip coil, such that the switching circuit of the normally closed relay provides the trip current to the trip coil when the switching circuit is in the on state, thereby tripping the circuit breaker, but ceases to provide the trip current to the trip coil when the switching circuit is in the off state, thereby allowing the line terminal and the load terminal to be in electrical communication with each other.

A monitoring circuit receives power from the main power circuit, downstream of the pair of main contacts, and being electrically connected to the relay activating circuit of the normally closed relay, the monitoring circuit supplying activating power to the relay activating circuit so long as a determination is made that the circuit breaker is operating within acceptable parameters, and ceasing to supply activating power to the relay activating circuit upon a determination being made that the circuit breaker is not operating within acceptable parameters, thereby tripping the circuit breaker.

In some embodiments, the trip coil requires greater energy, or power, to trip than the trip coil momentarily experiences prior to the switching circuit of the normally-closed relay being switched to its open state when the breaker is either switched to its closed state or when the breaker is first provided power while it is already in an unpowered, closed state. In some embodiments, a capacitive circuit is electrically connected between the output of the switching circuit of the normally closed relay and the trip coil.

In accordance with still another specific exemplary embodiment of the present invention, a circuit breaker includes a pair of main contacts movable with respect to each other between a closed position wherein a line terminal and a load terminal are in electrical communication with each other via a main power circuit, and an open position wherein the line terminal and the load terminal are electrically isolated from each other. A trip coil is connected to at least one of the pair of main contacts, the trip coil causing the pair of main contacts to move from the closed position to the open position in response to a trip current, thereby tripping the circuit breaker.

A normally closed relay has a relay activating circuit and a switching circuit, the switching circuit defaulting to an on state, but being switchable to an off state when activating power is supplied to the relay activating circuit, the switching circuit automatically returning to the on state when activating power to the relay activating circuit is interrupted.

An input of the switching circuit of the normally closed relay receives power from the main power circuit, downstream of the pair of main contacts, and an output of the switching circuit of the normally closed relay is electrically connected to the trip coil, such that the switching circuit of the normally closed relay provides the trip current to the trip coil when the switching circuit is in the on state, thereby tripping the circuit breaker, but ceases to provide the trip current to the trip coil when the switching circuit is in the off state, thereby allowing the line terminal and the load terminal to be in electrical communication with each other.

A monitoring circuit receives power from the main power circuit, upstream of the pair of main contacts, and being electrically connected to the relay activating circuit of the normally closed relay, the monitoring circuit supplying activating power to the relay activating circuit so long as a determination is made that the circuit breaker is operating within acceptable parameters, and ceasing to supply activating power to the relay activating circuit upon a determination being made that the circuit breaker is not operating within acceptable parameters, thereby tripping the circuit breaker.

Other objects of the invention and its particular features and advantages will become more apparent from consideration of the following drawings and accompanying detailed description.

DETAILED DESCRIPTION OF THE INVENTION

Figure 1:
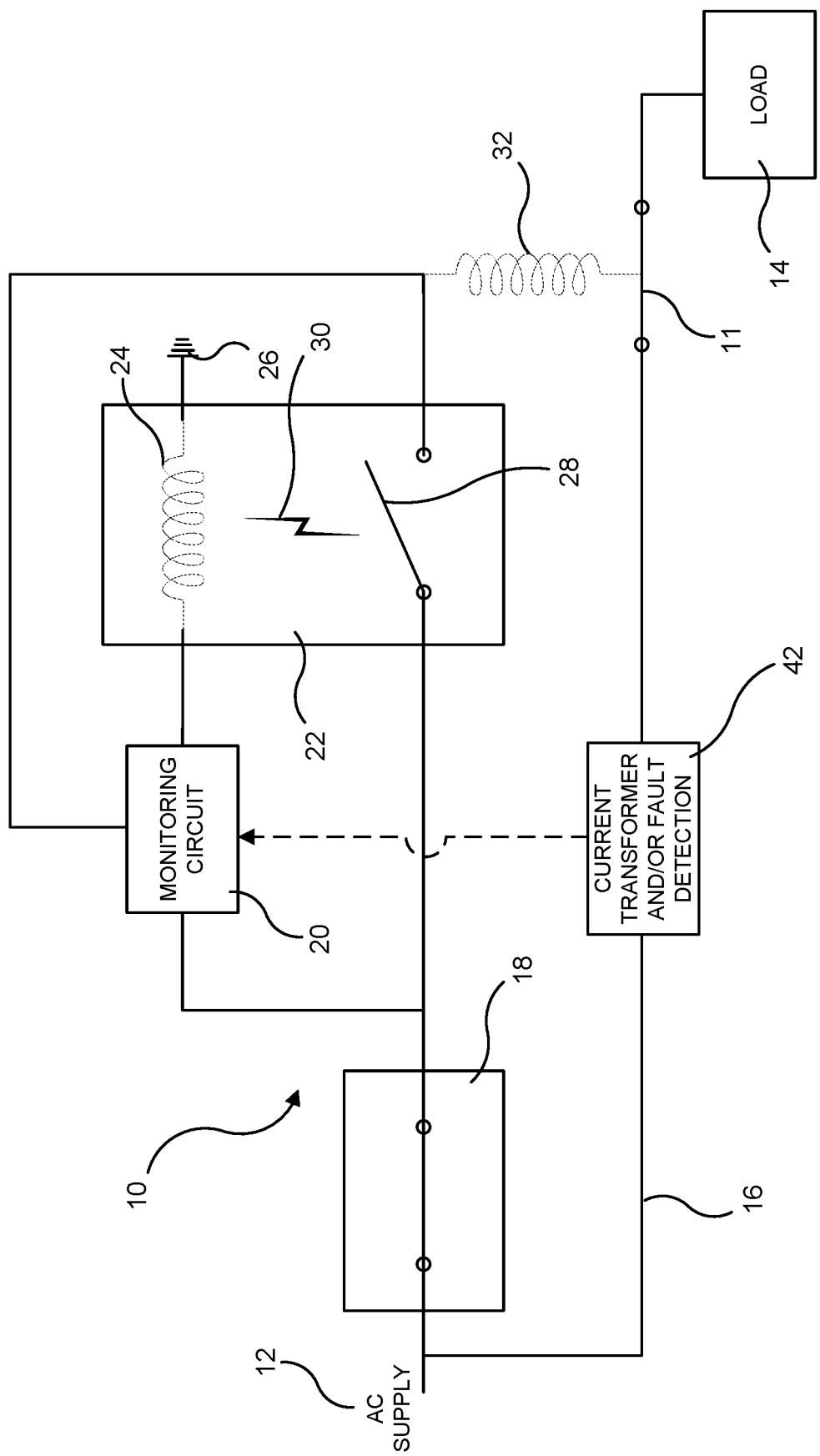
FIG. 1 is a schematic illustration of a circuit breaker with a protection configuration to render the breaker inoperable should there be a failure in the electronic monitoring circuitry according to an exemplary embodiment of the present invention, shown in a state where power is being supplied to a load.

Referring to the figures in detail and first to FIG. 1, there is shown an exemplary embodiment of an electronically controlled circuit breaker (10) that incorporates a mechanical contact mechanism (11) while maximizing the fail-safe level of the breaker (10) to insure its ability to provide the required circuit protection.

The circuit breaker (10) is electrically connected to an alternating current (AC) supply (12) via a line terminal that supplies power to an internal switch (18) of the circuit breaker (10), with the output of the internal switch (18) being fed to both an electronic monitoring circuit (20) and to the input terminal of the switching circuit (28) of a relay (22).

The relay (22) may be of various types, such as a solid state relay or an electro-mechanical relay, so long as the relay is of the normally closed type, meaning that the switching circuit (28) of the relay (22) will stay in, or will return to, the closed (i.e., ON) state when less than threshold activating power is being supplied to the activating circuit/coil (24) of the relay (22). As will be recognized by those of ordinary skill in the art, this lack of threshold activating power (i.e., causing the switching circuit (28) to be closed) may be the result of an intentional removal of power to the activating circuit/coil (24), may be the result of a failure in the circuit upstream of the relay (such as a failure in the monitoring circuit (20)), may be the result of a failure in the activating circuit/coil (24) of the relay (22) itself, etc. However, whatever the cause, when threshold activating power is not supplied to the activating circuit/coil (24) of the relay (22), the switching circuit (28) of the relay (22) is closed (i.e., on), as shown in FIG. 2.

The electronic monitoring circuit (20) of the breaker (10) has an output to either the activating input of the solid state relay circuit, or the coil of the electro-mechanical relay, depending upon which type of relay (22) is employed, which will, when energized (indicated at 30 in FIG. 1), result in the normally closed switching circuit (28) of the relay (22) being switched to the open (i.e., off) position (again, as shown in FIG. 1). Thus, under normal conditions, this output feed from the electronic monitoring circuit (20) provides threshold activating power to the activating circuit/coil (24) of the relay (22) (the other side of which is generally connected to common neutral (26)), with the result that the switching circuit (28) of the relay (22) will switch to its open (i.e., off) position and thus not provide power to the trip coil (32), thereby enabling the mechanical contacts (11) of the breaker (10) to be turned on (i.e., closed) normally, with the result being that AC supply (12) is electrically connected to the load (14) via a load terminal electrically connected to the main power circuit (16).

As should be recognized, the internal switch (18) may be omitted if desired, and the electronic monitoring circuit (20) may instead receive power directly from the power supply (12) supplying power to the line terminal. In this configuration, whenever power is supplied to the circuit breaker line terminal from power supply (12), the electronic monitoring circuit (20) would be powered on, and, should the electronic monitoring circuit (20) be operating properly, power would be supplied to the to the activating circuit/coil (24) of the normally closed relay (22), switching the switching circuit (28) of the relay (22) to its open (i.e., off) state. The normally closed relay (22) would thereby remain in its off state while the breaker (10) is in its off state as long as power is being supplied to the line input of the breaker (10) and the electronic monitoring circuit (20) is operating properly. With the switching circuit (28) of the normally closed relay (22) being in its open (i.e., off) state, the breaker (10) would be able to be operated normally.

Figure 2:
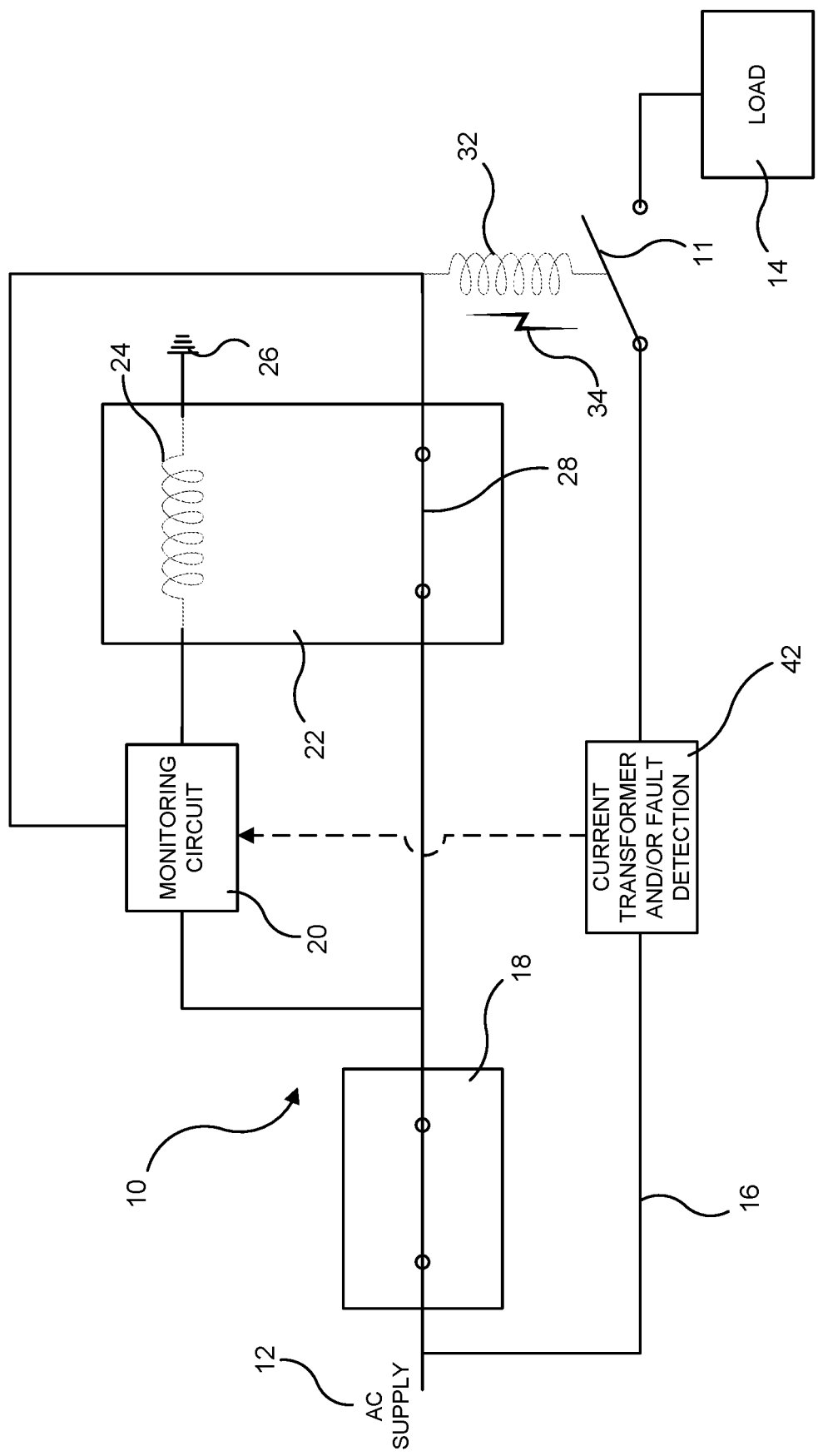
FIG. 2 is a schematic illustration of the circuit breaker of FIG. 1, shown in a state where a fault condition has caused power to no longer be supplied to the load.

Turning now specifically to FIG. 2, the electronic monitoring circuit (20) is programmed with the operating parameters desired for the breaker's application, such as current trip point, inrush capability, ground fault thresholds, arc fault thresholds, etc. Should any of these parameters not be met, the electronic monitoring circuit (20) causes tripping of the breaker.

This may be accomplished in various ways. In some cases, the monitoring circuit (20) may be electrically connected directly to the trip coil (32), such that if any of the programmed parameters are not met, the monitoring circuit (20) sends a trip current directly to the trip coil (32). In such cases, the normally closed relay (22) would function only as a failsafe in the event of a failure in the monitoring circuit (20) or some other component of the circuit breaker (10), with typical non-failure tripping (e.g., in the event of an overcurrent, ground fault, arc fault, etc.) not employing the normally closed relay (22). Such a configuration may be desirable to provide system redundancy.

Alternately, it may be desirable in some cases for the normally closed relay (22) to be employed both for typical non-failure tripping (e.g., in the event of an overcurrent, ground fault, arc fault, etc.) and for tripping in the case of a failure of the breaker (10). In such cases, if any of the programmed parameters are not met, the monitoring circuit (20) ceases sending activating power to the activating circuit/coil (24) of the normally closed relay (22), with the result that the switching circuit (28) of the relay (22) returns to its normally-closed (i.e., on) state, thus connecting power to the trip coil (32) and tripping the breaker (10) by opening the contacts (11) (indicated by (34) in FIG. 2).

In either alternative, however, as part of the failsafe operation, the electronic monitoring circuit (20) continually monitors itself, and, should it detect a problem in its operability, ceases to send activating power to the activating circuit/coil (24) of the relay (22), resulting in the closing of the relay's normally-closed switching circuit (28) thereby powering the trip coil (32) and tripping the contacts (11) of the breaker (10). Also, should the power to the electronics fail for any reason, the activating circuit/coil (24) of the relay (22) does not receive power, and the switching circuit (28) of the relay (22) would thereby be in, or return to, its normally closed state, and the breaker (10) would be tripped.

If desired, a sensor (42) may be provided in the main power circuit (16), which may provide sensor data to the monitoring circuit (20) for use as part of evaluating whether the specified parameters are being satisfied. The sensor (42) may be, for example, a current transformer to aid in evaluating whether an overcurrent situation exists, or may be a ground fault and/or arc fault detecting circuit and/or coil. Various other sensors may also be provided, if desired, to aid the monitoring circuit (20) in evaluating the electrical current passing through the circuit breaker and/or the breaker itself.

Figure 3:
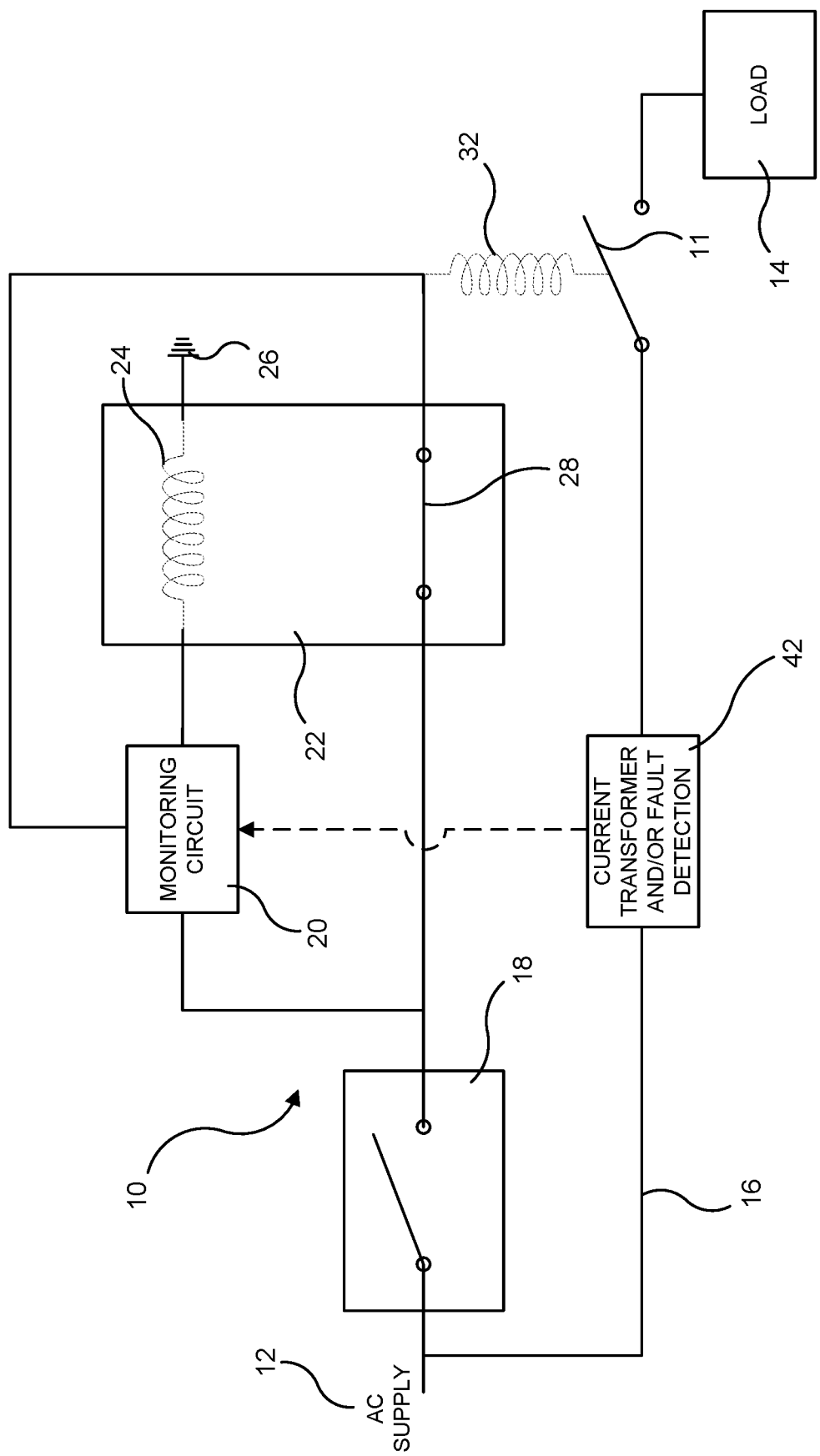
FIG. 3 is a schematic illustration of the circuit breaker of FIG. 1, shown in a state where an internal switch is in the open (i.e., off) position and power is not being supplied to the load.

With reference now to FIG. 3, as the breaker is tripped and the contacts (11) are opened, the internal switch (18) may also be caused to move to its open (i.e., off) state to avoid unnecessary continuous power being supplied to the trip coil (32), since once the trip coil (32) caused the contacts (11) to open, further energization of the trip coil (32) provides no benefit. Similarly, if the breaker (10) is manually turned off by opening the contacts (11) via actuation of a handle or the like, the internal switch (18) may also be caused to move to its open (i.e., off) state, since monitoring of an already off circuit breaker is not necessary.

This internal switch (18) is actuated back to its closed (i.e., on) state prior to the breaker's contacts (11) of main output circuit (16) being switched to their closed (i.e., on) state (as shown again in FIG. 1), and thus the electronic protection circuitry is activated prior to the breaker providing power to its connected load (14).

Figure 4:
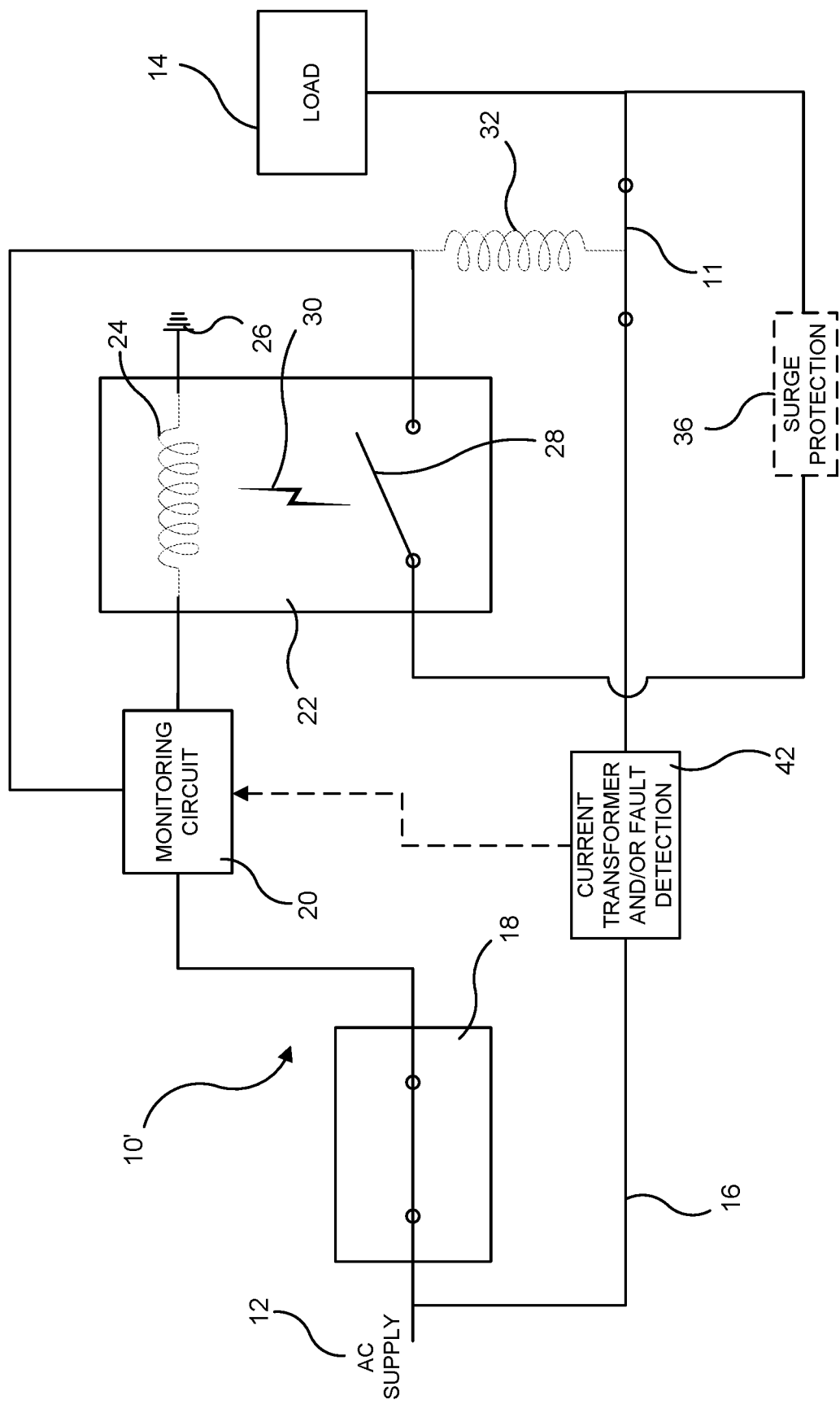
FIG. 4 is a schematic illustration of a circuit breaker similar to the circuit breaker of FIG. 1 but with a slightly different circuit configuration, shown in a state where power is being supplied to a load.
Figure 5:
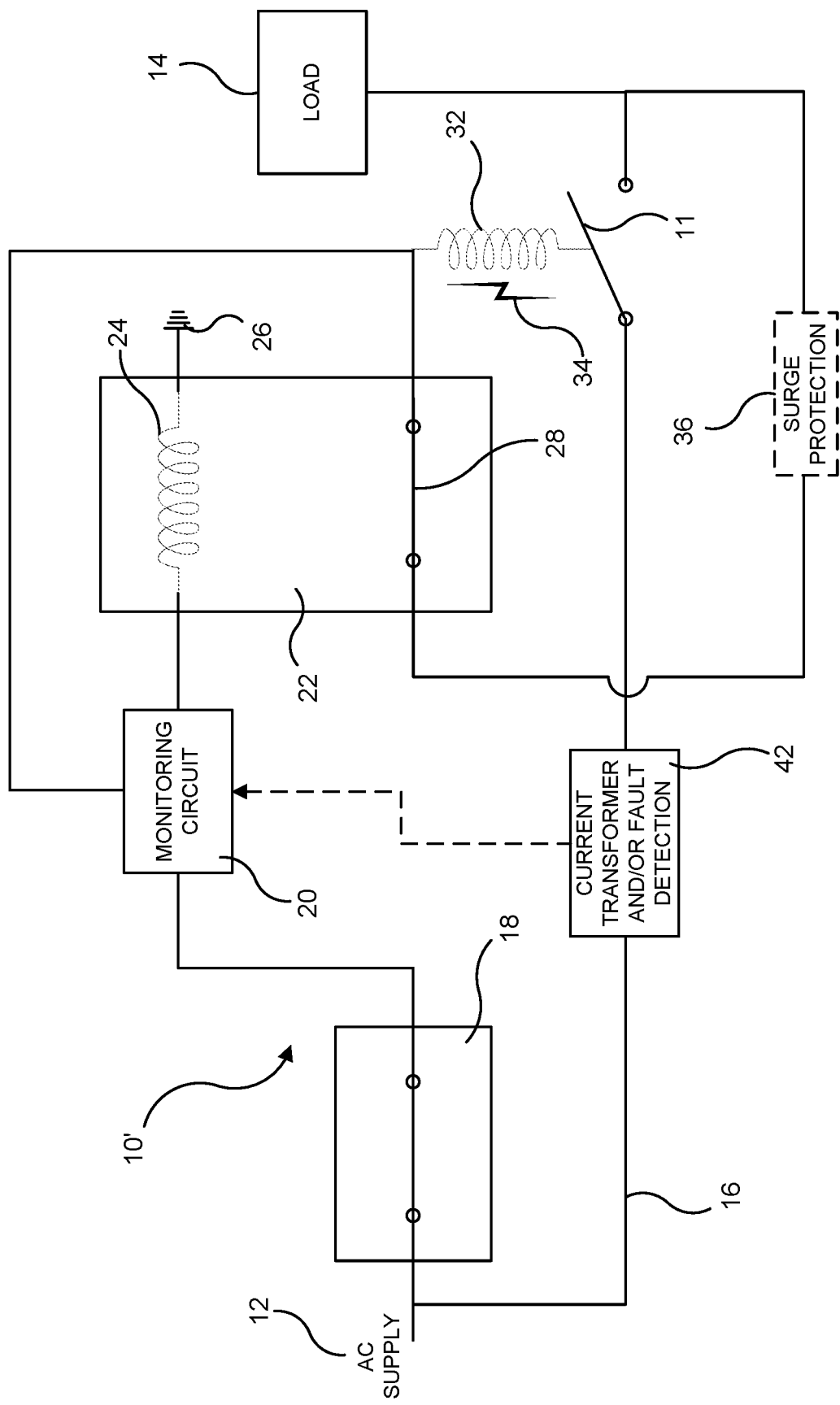
FIG. 5 is a schematic illustration of the circuit breaker of FIG. 4, shown in a state where a fault condition has caused power to no longer be supplied to the load.
Figure 6:
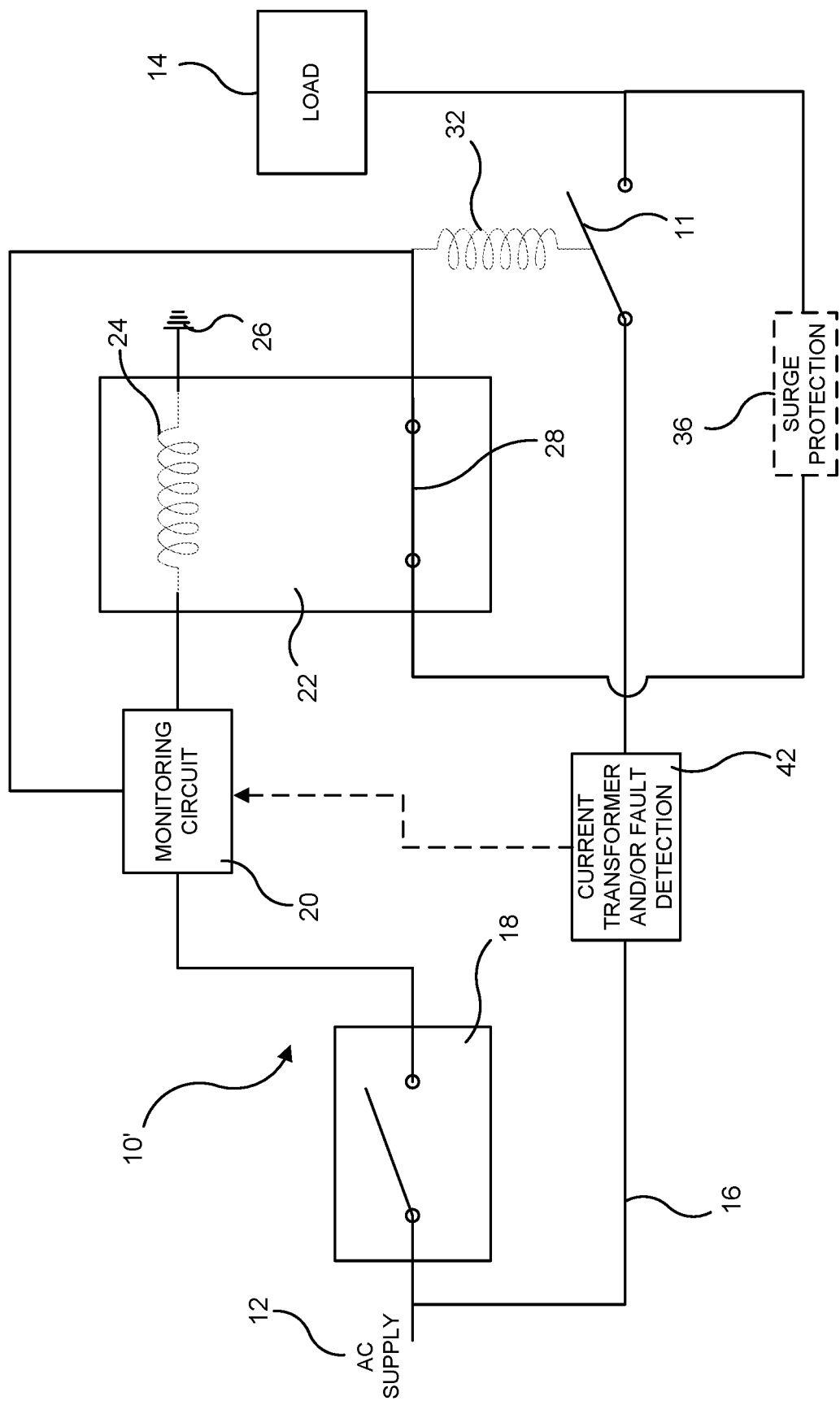
FIG. 6 is a schematic illustration of the circuit breaker of FIG. 4, shown in a state where an internal switch is in the open (i.e., off) position and power is not being supplied to the load.

Turning now to FIGS. 4-6, a second exemplary embodiment of a circuit breaker (10') constructed in accordance with the present invention is shown. The circuit breaker (10') of FIGS. 4-6 is very similar to the circuit breaker (10) of FIGS. 1-3, with like elements being shown using the same reference signs.

Referring specifically to FIG. 4, the output of the internal switch (18) is again fed to the electronic monitoring circuit (20). However, in circuit breaker (10'), rather than the switching circuit (28) of the normally closed relay (22) also being electrically connected to the output of the internal switch (18), the switching circuit (28) is internally electrically connected to the main power circuit (16) in the vicinity of the output terminal of the breaker (10'), i.e., downstream of the contacts (11). Appropriate inline surge protection (36) may be provided, as needed, to the normally closed switching circuit of the relay.

As with circuit breaker (10), the electronic monitoring circuit (20) of the breaker (10') has an output to either the activating input of the solid state relay circuit, or the coil of the electro-mechanical relay, depending upon which type of relay (22) is employed, which will, when energized (indicated at (30)), result in the relay's normally closed switching circuit (28) being switched to the open (i.e., off) position. Thus, under normal conditions (as shown in FIG. 4), the output feed from the electronic monitoring circuit (20) keeps the relay's switching circuit (28) in its open (i.e., off) position and thus, with the breaker in its "on" state, not provide power to the trip coil (32), thereby allowing the breaker (10') to remain "on" and operate normally.

As previously, the electronic monitoring circuit (20) is programmed with the operating parameters desired for the breaker's application, such as current trip point, inrush capability, ground fault thresholds, arc fault thresholds, etc. Should any of these parameters not be met, the electronic monitoring circuit (20) causes tripping of the breaker.

This may be accomplished in various ways. In some cases, the monitoring circuit (20) may be electrically connected directly to the trip coil (32), such that if any of the programmed parameters are not met, the monitoring circuit (20) sends a trip current directly to the trip coil (32). In such cases, the normally closed relay (22) would function only as a failsafe in the event of a failure in the monitoring circuit (20) or some other component of the circuit breaker (10'), with typical non-failure tripping (e.g., in the event of an overcurrent, ground fault, arc fault, etc.) not employing the normally closed relay (22). Such a configuration may be desirable to provide system redundancy.

Alternately, it may be desirable in some cases for the normally closed relay (22) to be employed both for typical non-failure tripping (e.g., in the event of an overcurrent, ground fault, arc fault, etc.) and for tripping in the case of a failure of the breaker (10'). In such cases, if any of the programmed parameters are not met, the monitoring circuit (20) ceases sending activating power to the activating circuit/coil (24) of the normally closed relay (22), with the result that the switching circuit (28) of the relay (22) returns to its normally-closed (i.e., on) state (as shown in FIG. 5), and thus, as the breaker (10') reaches its "on" position, power would be fed through the relay's switching circuit (28) to the trip coil (32) and open the contacts (11) to trip the breaker (10').

In either alternative, however, as part of the failsafe operation, the electronic monitoring circuit (20) continually monitors itself, and, should it detect a problem in its operability, ceases to send activating power to the activating circuit/coil (24) of the relay (22), again resulting in the closing of the relay's normally-closed switching circuit (28) and tripping the breaker whether the breaker is already "on" or is in the process of being switched to its "on" state, since power would flow through the switching circuit (28) of the relay (22) to the trip coil (32). Also, should the power to the electronics fail for any reason, the relay would not receive activating power, and would thereby be in, or return to, its normally closed state, and the breaker (10') would be tripped.

Furthermore, as shown in FIG. 6, should the internal switch (18) of the breaker (10') be turned off (i.e., opened), power would cease being supplied to the monitoring circuit (20) and consequently to the activating circuit/coil (24) of the relay (22), resulting in the closing of the relay's normally-closed switching circuit (28) thereby powering the trip coil (32) and tripping the contacts (11) of the breaker (10). As can be seen, any attempt to close the contacts (11) without first returning the internal switch (18) to its closed (i.e., on) position would result in immediate tripping of the contacts (11) open again.

As with circuit breaker (10), if desired, a sensor (42) may be provided in the main power circuit (16), which may provide sensor data to the monitoring circuit (20) for use as part of evaluating whether the specified parameters are being satisfied. The sensor (42) may be, for example, a current transformer to aid in evaluating whether an overcurrent situation exists, or may be a ground fault and/or arc fault detecting circuit and/or coil. Various other sensors may also be provided, if desired, to aid the monitoring circuit (20) in evaluating the electrical current passing through the circuit breaker and/or the breaker itself.

Turning now to FIGS. 7-11, a third exemplary embodiment of a circuit breaker (10") constructed in accordance with the present invention is shown. The circuit breaker (10") of FIGS. 7-11 is very similar in certain respects to the circuit breakers (10, 10') of FIGS. 1-6, with like elements being shown using the same reference signs.

Figure 7:
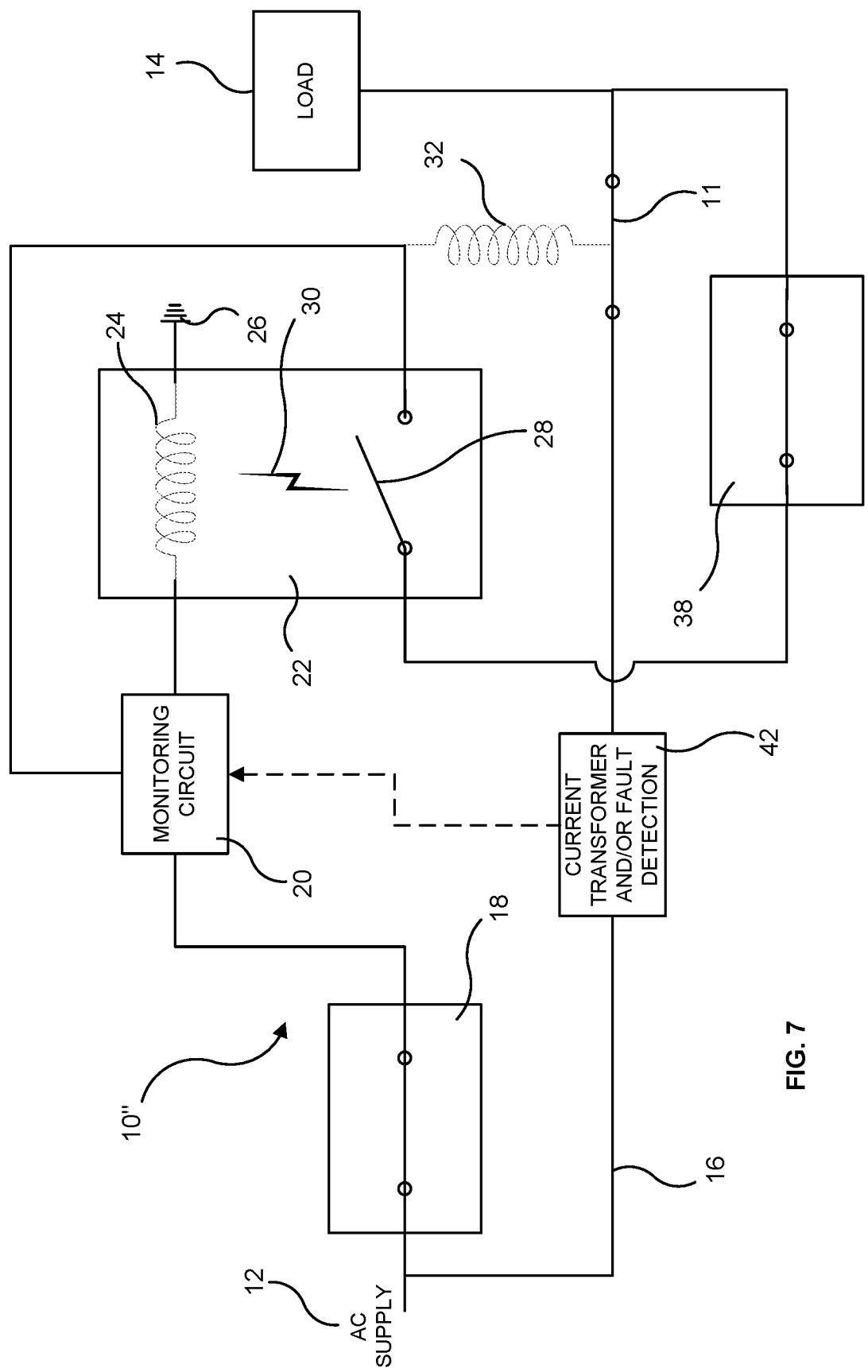
FIG. 7 is a schematic illustration of a circuit breaker similar to the circuit breaker of FIG. 1 but with a slightly different circuit configuration, shown in a state where power is being supplied to a load.
Figure 8:
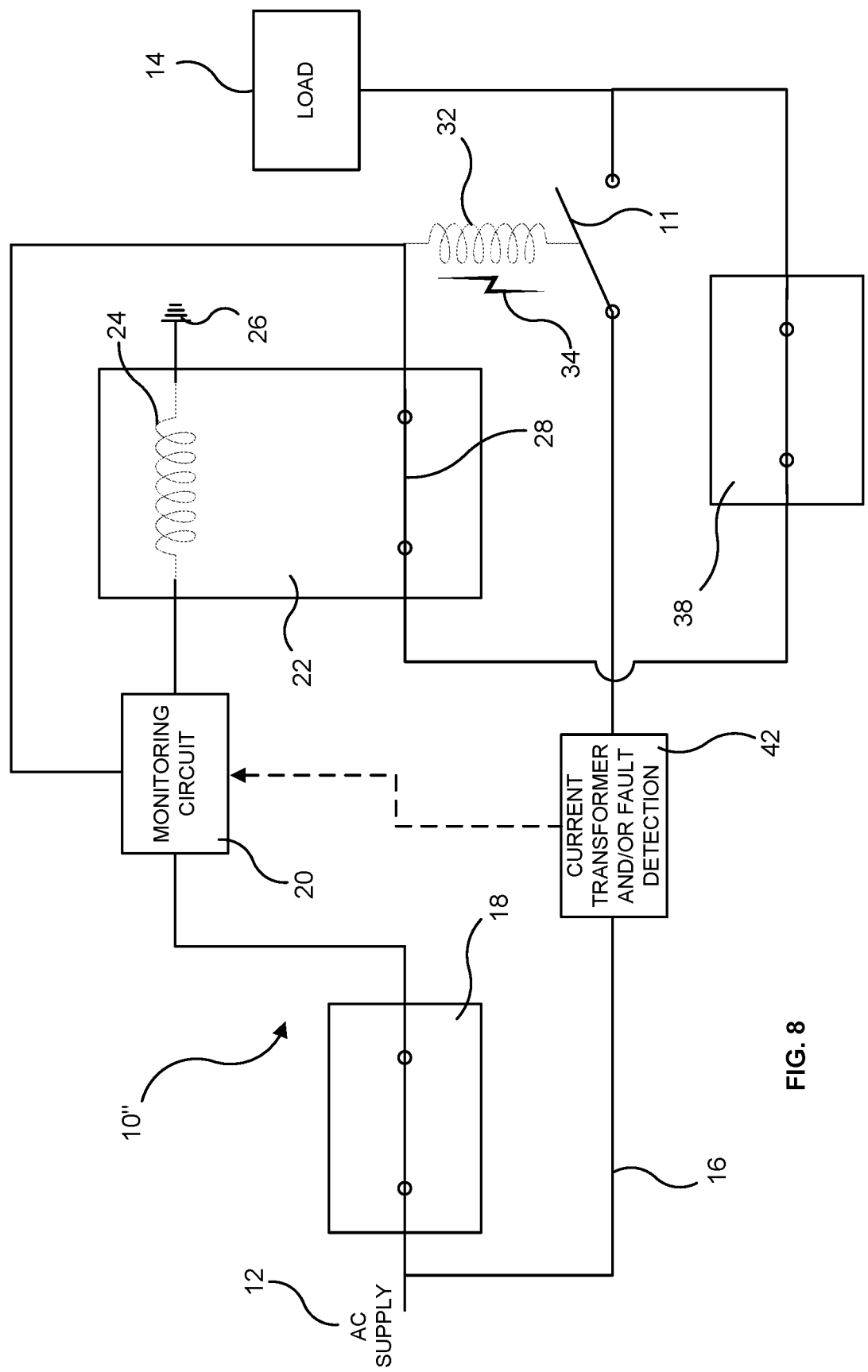
FIG. 8 is a schematic illustration of the circuit breaker of FIG. 7, shown in a state where a fault condition has caused power to no longer be supplied to the load.
Figure 9:
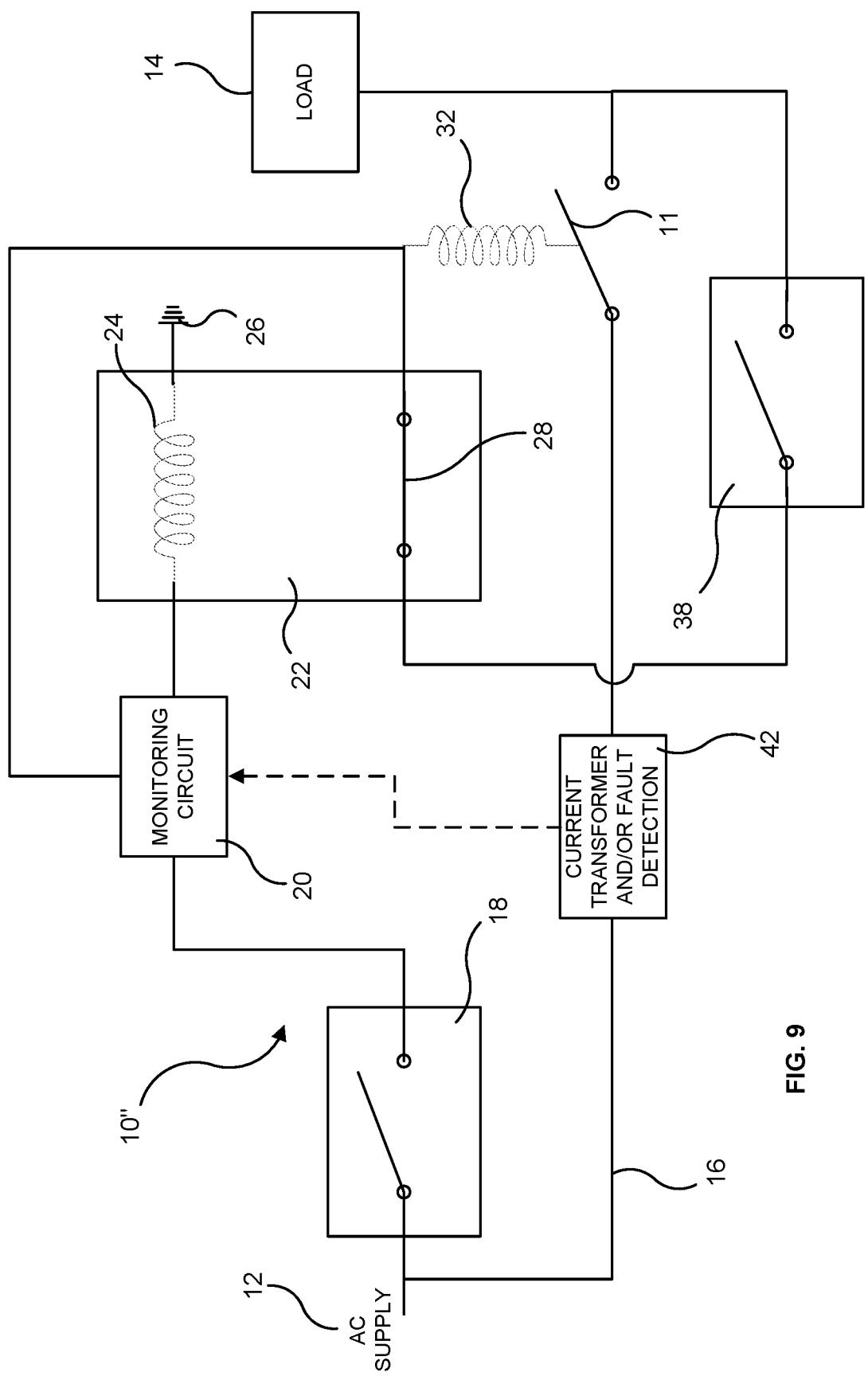
FIG. 9 is a schematic illustration of the circuit breaker of FIG. 7, shown in a state where an internal main switch is in the open (i.e., off) position, a trip circuit switch is in the open (i.e., off) position, and power is not being supplied to the load.
Figure 10:
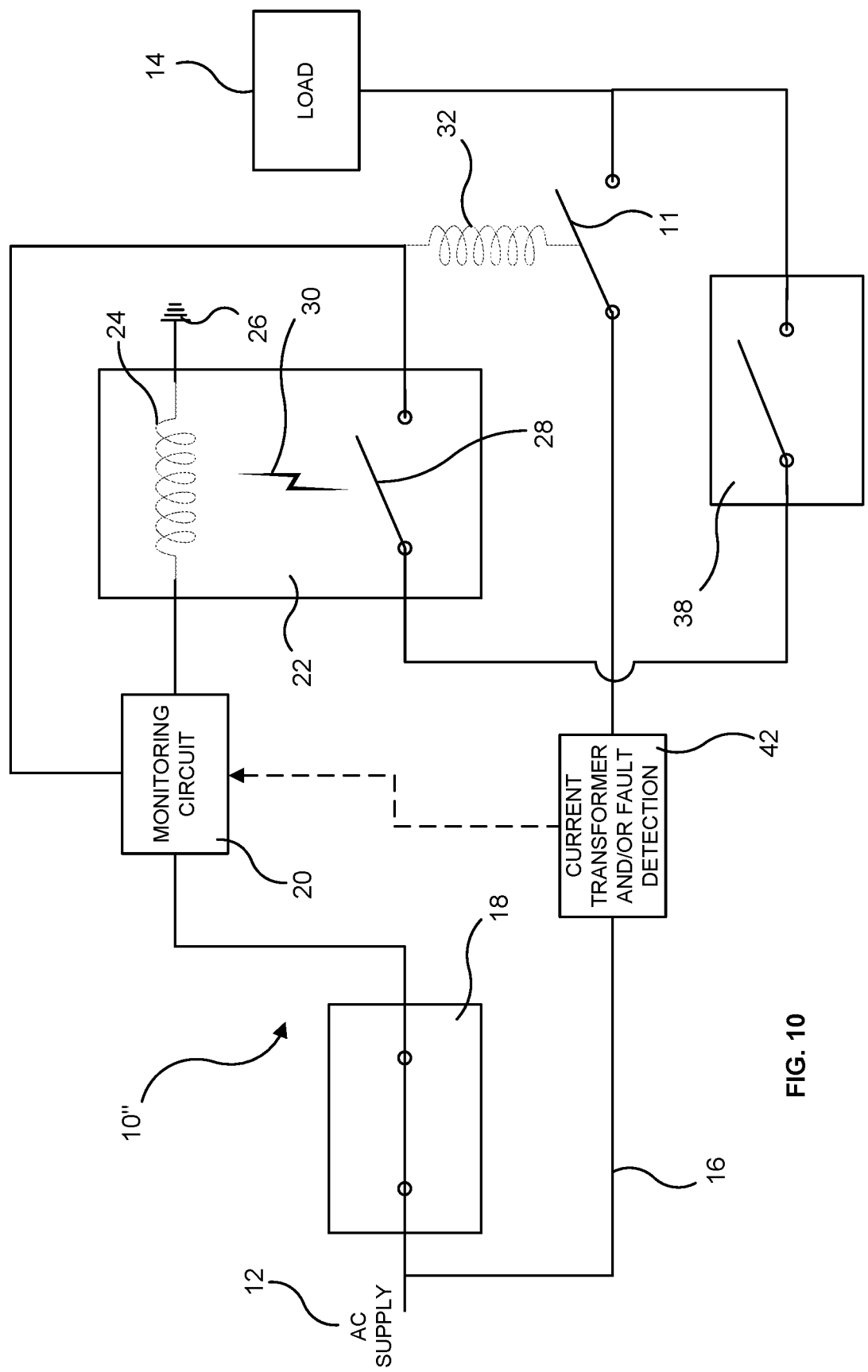
FIGS. 10 and 11 are schematic illustrations of the circuit breaker of FIG. 7, shown in transitory states as the circuit breaker is being switched from an off state to an on state.

Referring first to FIGS. 7 and 8, in addition to the internal switch (18) that provides power to the electronic control circuitry (20), the circuit breaker (10") employs an additional trip circuit switch (38) connected to the input terminal of the normally closed switching circuit (28) of the relay (22). Internal switch (18) thus provides power to the electronic protection circuitry (20) as the breaker (10") is mechanically actuated toward its "on" position and prior to the breaker's main contacts (11) being in the closed (i.e., on)

position. FIG. 9 shows all three of the main contacts (11), internal switch (18) and trip circuit switch (38) in the open (i.e., off) positions. FIG. 10 shows the situation where the breaker (10") is in the process of being actuated toward its "on" position, where the internal switch (18) has been turned on (i.e., closed), but the trip circuit switch (38) and the main contacts (11) are still off (i.e., open).

Figure 11:
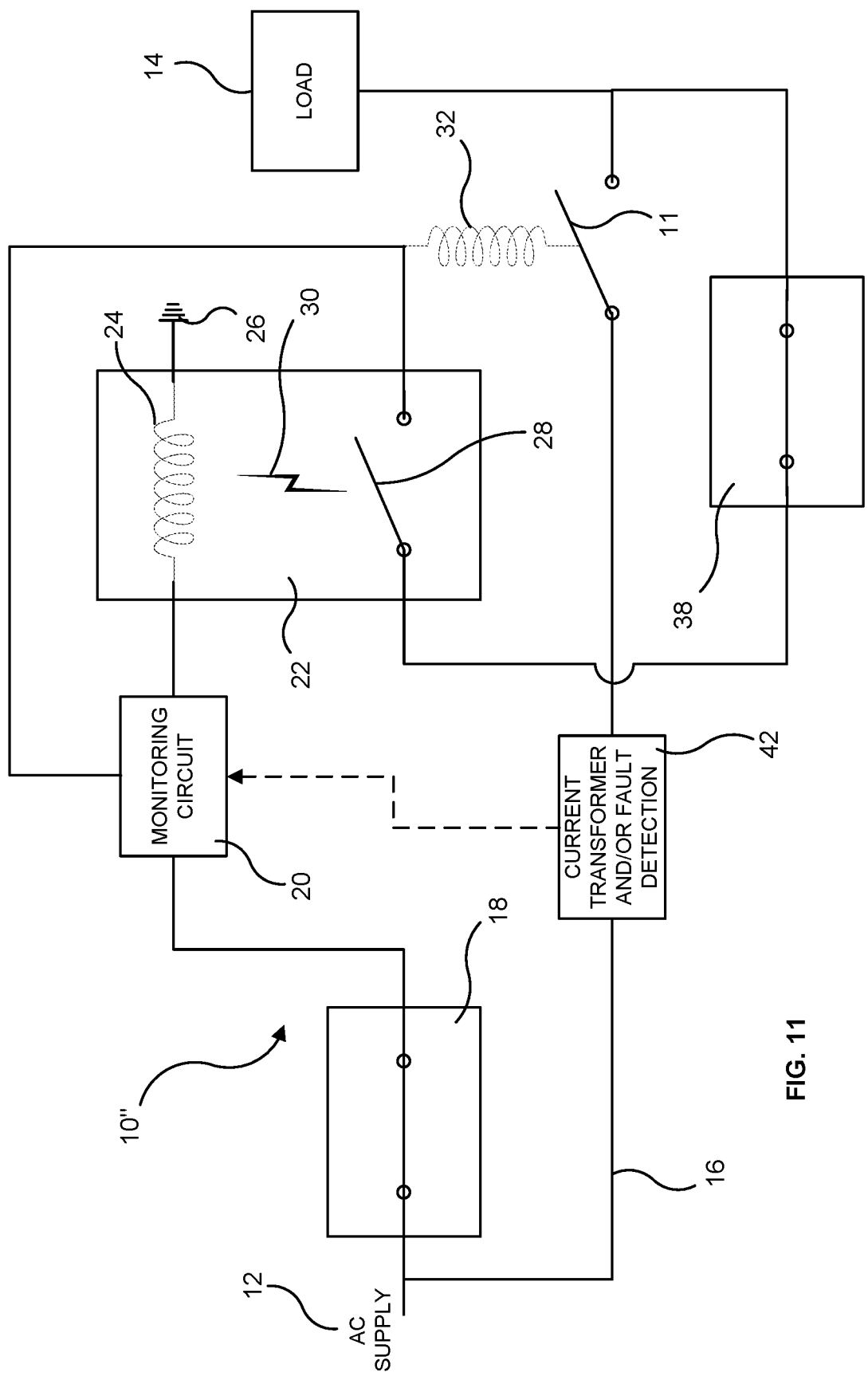

Trip circuit switch (38) will then be switched to its closed (i.e., on) position, again prior to the breaker's main contacts (11) being in the closed (i.e., on) position, but subsequent to the internal switch (18) being switched to its closed (i.e., on) position. This state is shown in FIG. 11.

Trip circuit switch (38) is configured to be activated downstream of the breaker's trip mechanism (32) which results in the power from the trip circuit switch (38) being immediately switched off (i.e., opened) when the breaker (10") is tripped. Closing of the trip circuit switch (38) may be accomplished by contact being made with a contact arm of the breaker (10") prior to the contact arm closing the breaker's main contacts (11). This configuration assures that the trip coil (32) only experiences a short, momentary power pulse as it trips the breaker (10").

More specifically, a leaf spring contact may be employed as trip circuit switch (38) to contact with the contact arm of the breaker (10") and thereby provide power to the relay's normally-closed switching circuit (28) just prior to the contact arm closing the main contacts (11) of the breaker (10"). This assures the trip current to the trip coil (32) would only be instantaneous as it would end immediately as the breaker is tripped. If desired, a double leaf spring contact arrangement could be employed to additionally embody internal switch (18) to enable, first, power being sent to the electronics and, subsequently, power being sent to the relay's normally-closed switching circuit (28), again prior to the breaker main contacts (11) being closed.

Thus, as the breaker (10") is turned on, the electronic protection circuitry (20) is first powered, and, conditionally, upon power being provided to the electronics and the correct functioning of the electronic control circuitry (20), power is provided by the electronic control circuitry (20) to activating circuit/coil (24) of the normally-closed relay (22). The switching circuit (28) of the relay (22) is thereby powered to its open (i.e., off) position. As the breaker (10") is continuing to be actuated to its "on" position, trip circuit switch (38) is turned to its closed (i.e., on) position and it provides power to the switching circuit (28) of the relay (22). With the electronic circuitry operating properly and providing power to the relay, no power will be provided to the coil of the trip solenoid (32) and the main contacts (11) of the breaker (10") will be able to be turned to their closed (i.e., on) position, thereby providing power the connected load (14). This is illustrated in FIG. 7.

If, however, power is not provided to the electronic circuitry or if the electronic circuitry itself fails, no activating power would be provided to the activating circuit/coil (24) of the relay (22) and the normally closed switching circuit (28) would remain in its closed (i.e., on) position. As trip circuit switch (38) closes (i.e., turns on), power would be provided to the switching circuit (28) of the relay (22) and thus to the trip solenoid (32), with the trip solenoid (32) thereby immediately tripping the circuit breaker (10"). Furthermore, if there were a failure of the normally-closed relay (22), the breaker (10") would be unusable as, whenever the breaker (10") was actuated and the trip circuit switch (38) closed (i.e., turned on), the switching circuit (28) of the relay (22) would be in its normally closed position and thus conduct current to actuate the trip solenoid (32) and trip the breaker (10").

The electronic monitoring circuit (20) is programmed with the operating parameters desired for the breaker's application, such as current trip point and, if provided, inrush capability. Should any of these parameters be violated, the electronic monitoring circuit (20) causes tripping of the breaker (10") in a manner similar to that described above.

The electronic monitoring circuit (20) may be programmed to continually monitor itself, and, should it detect a problem in its operability, to cease sending activating power to the activating circuit/coil (24) of the relay (22), resulting in the closing of the relay's normally-closed switching circuit (28), which would then power the trip coil (32) and trip the breaker (10").

Turning now to FIGS. 12-15, a fourth exemplary embodiment of a circuit breaker (10''') constructed in accordance with the present invention is shown. The circuit breaker (10''') of FIGS. 12-15 is very similar to the circuit breakers (10, 10', 10") of FIGS. 1-11 in many respects, with like elements being shown using the same reference signs.

Figure 12:
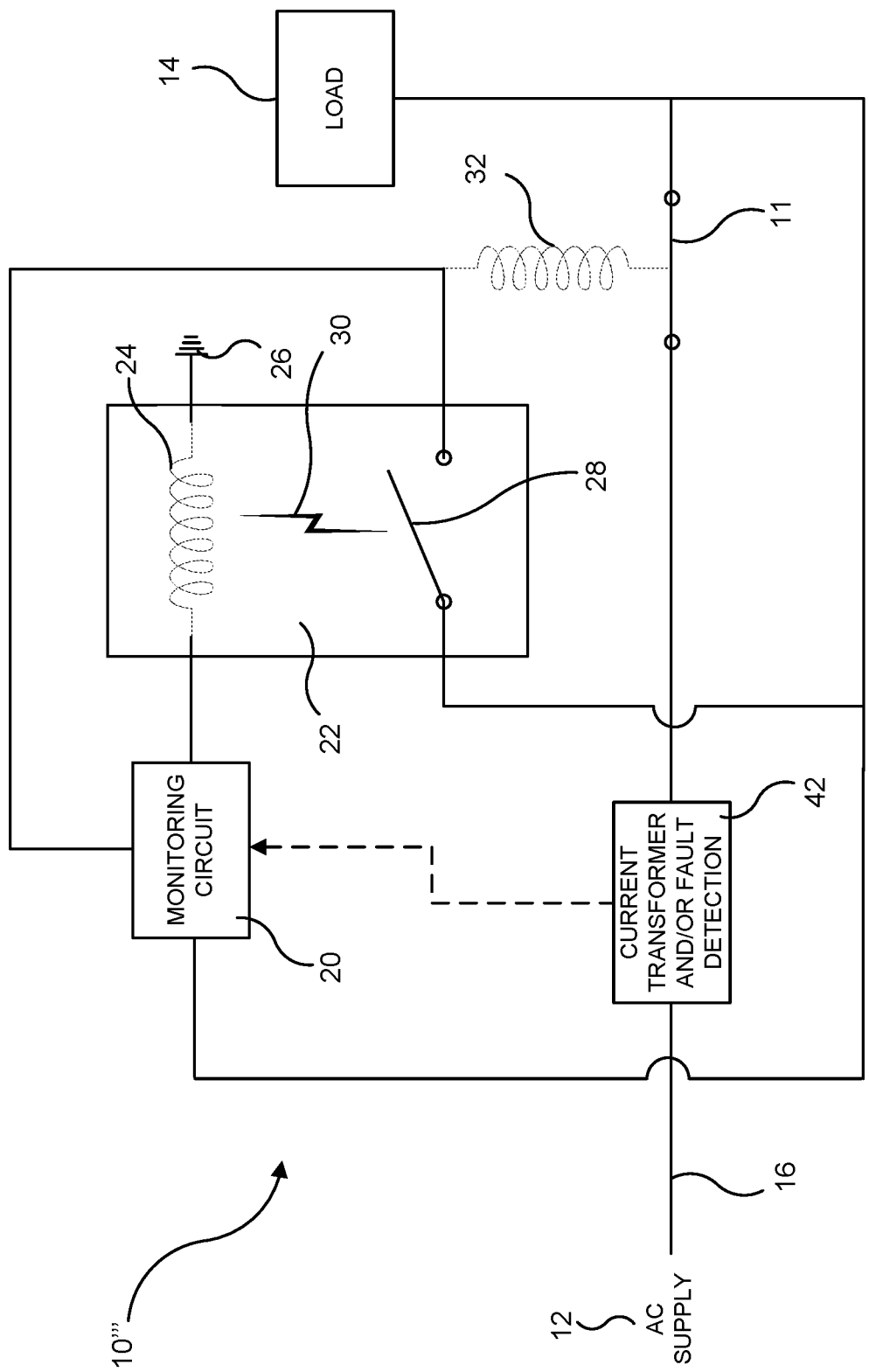
FIGS. 12-15 are schematic illustrations of another embodiment of a circuit breaker similar to the circuit breaker of FIG. 1 but with a slightly different circuit configuration, shown in a state where power is being supplied to a load (FIGS. 12 and 14) and in a transitory states as the circuit breaker is being switched from an off state to an on state or as power is being applied to an unpowered breaker already in an on state (FIGS. 13 and 15).
Figure 14:
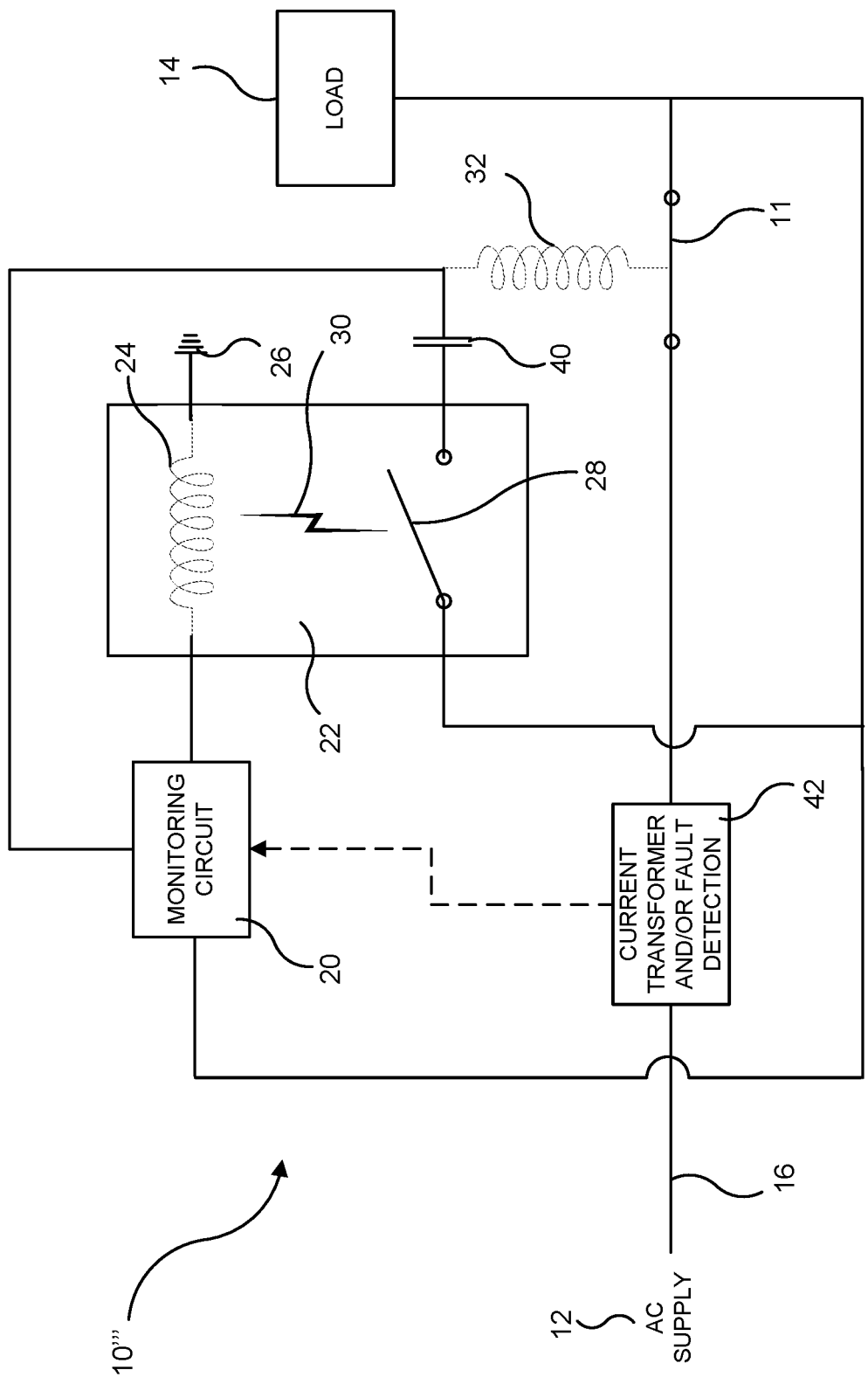

Referring specifically to FIGS. 12 and 14, in this configuration both the electronic monitoring circuit (20) and the input terminal of the switching circuit (28) of the normally-closed relay (22) are internally connected to the main power circuit (16) in the vicinity of the output load terminal of the breaker (10'''), i.e., downstream of the contacts (11). When the breaker (10''') is powered and is switched to its closed (i.e., on) position, power will thus be supplied to the electronic monitoring circuit (20) and to the input terminal of the input terminal of the switching circuit (28) of the normally-closed relay (22). The output terminal of the switching circuit (28) of the normally-closed relay (22) is, as with previous embodiments, connected to the breaker trip coil (32).

The electronic monitoring circuit (20) of the breaker (10''') controls a power feed to the activating input of a solid state relay, or to the coil of an electro-mechanical relay, depending upon which type is employed. The switching circuit (28) of the normally closed relay (22) will thereby switch to its open (i.e., off) position, upon its activating circuit/coil (24) being supplied power from the electronic monitoring circuit (20).

The electronic monitoring circuit (20), upon being powered, is programmed to immediately provide power to the activating circuit/coil (24) of the normally-closed relay (22), thereby activating the switching circuit (28) of the normally closed relay (22) to its open (i.e., non-conducting) state. The electronic monitoring circuit (20) subsequently monitors the breaker's output to its connected load (14), and, should the electronic monitoring circuit (20) determine that prescribed protective parameters are not being met, then causes tripping of the breaker (10''').

As with the embodiments described above, this may be accomplished in various ways. In some cases, the monitoring circuit (20) may be electrically connected directly to the trip coil (32), such that if any of the programmed parameters are not met, the monitoring circuit (20) sends a trip current directly to the trip coil (32). In such cases, the normally closed relay (22) would function only as a failsafe in the event of a failure in the monitoring circuit (20) or some other component of the circuit breaker (10'''), with typical non-failure tripping (e.g., in the event of an overcurrent, ground fault, arc fault, etc.) not employing the normally closed relay (22). Such a configuration may be desirable to provide system redundancy.

Alternately, it may be desirable in some cases for the normally closed relay (22) to be employed both for typical non-failure tripping (e.g., in the event of an overcurrent, ground fault, arc fault, etc.) and for tripping in the case of a failure of the breaker (10'''). In such cases, if any of the programmed parameters are not met, the monitoring circuit (20) ceases sending activating power to the activating circuit/coil (24) of the normally closed relay (22), with the result that the switching circuit (28) of the relay (22) returns to its normally-closed (i.e., on) state, thus connecting power to the trip coil (32) and tripping the breaker (10''') by opening the contacts (11).

In either alternative, however, as part of the failsafe operation, the electronic monitoring circuit (20) continually monitors itself, and, should it detect a problem in its operability, ceases to send activating power to the activating circuit/coil (24) of the relay (22), resulting in the closing of the relay's normally-closed switching circuit (28) thereby powering the trip coil (32) and tripping the contacts (11) of the breaker (10'''). Also, should the power to the electronics fail for any reason, the activating circuit/coil (24) of the relay (22) does not receive power, and the switching circuit (28) of the relay (22) would thereby be in, or return to, its normally closed state, and the breaker (10''') would be tripped.

Also, as described above, if desired, a sensor (42) may be provided in the main power circuit (16), which may provide sensor data to the monitoring circuit (20) for use as part of evaluating whether the specified parameters are being satisfied. The sensor (42) may be, for example, a current transformer to aid in evaluating whether an overcurrent situation exists, or may be a ground fault and/or arc fault detecting circuit and/or coil. Various other sensors may also be provided, if desired, to aid the monitoring circuit (20) in evaluating the electrical current passing through the circuit breaker and/or the breaker itself.

When the breaker (10''') is either switched to its closed (i.e., on) state, or, alternatively, is provided power while it is already in an unpowered, closed (i.e., on) state, power will be fed simultaneously to both the electronic monitoring circuit (20) and to the input terminal of the switching circuit (28) of the normally closed relay (22). As the switching circuit (28) will be in its closed (i.e., on) state until the electronic monitoring circuit (20) is able to provide power the activating circuit/coil (24) to thereby activate the switching circuit (28) to its open (i.e., off) state, the trip coil (32) will experience a short pulse of power until the monitoring circuit (20) is able to cause actuation of the switching circuit (28) to its open (i.e., off) state. This momentary condition where both the main contacts (11) and the switching circuit (28) of the normally closed relay (22) are in the closed (i.e., on) state is shown in FIGS. 13 and 15).

Upon being powered, however, the electronic monitoring circuit (20) will react within a very short period of time, as measured in milliseconds, to send power to the activating circuit/coil (24) to thereby activate the switching circuit (28) to its open (i.e., off) state and disconnect power being fed to the trip coil (32), thereby reverting very quickly back to the condition shown in FIGS. 12 and 14. Upon being supplied power, the normally closed relay (22) will also react in a very short period of time to open the switching circuit (28), with an electronic solid state relay reacting in a shorter period of time than an electro-mechanical relay, depending upon which is employed.

The trip coil (32) will thus experience a short, momentary, input of power. To prevent the trip coil (32) from tripping the breaker as it is being turned to its closed (i.e., on) position, or otherwise prevent tripping the breaker when power is restored while the breaker is already in its closed (i.e., on) position, two alternative configurations, or a combination of the two, are employed.

Figure 13:
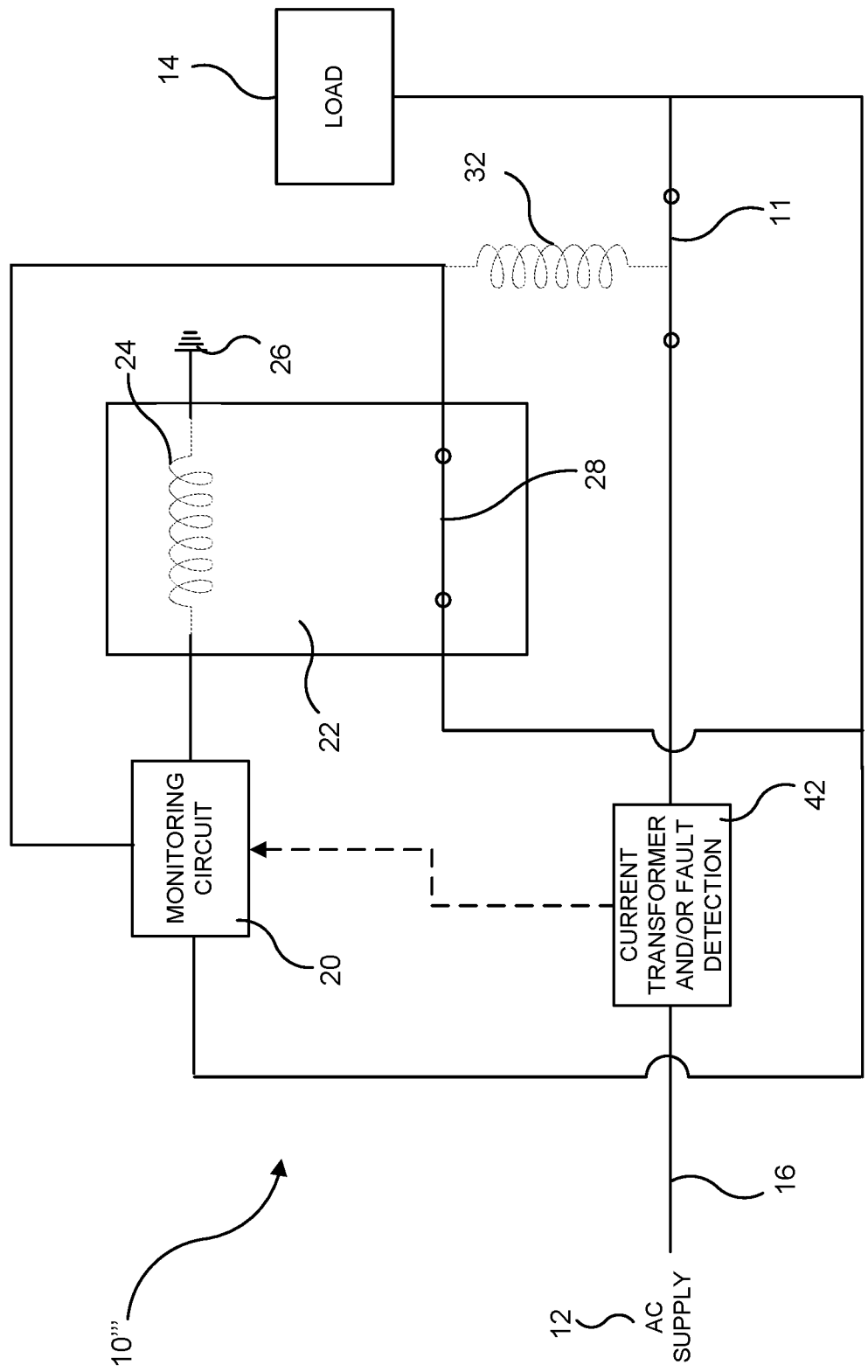
Figure 15:
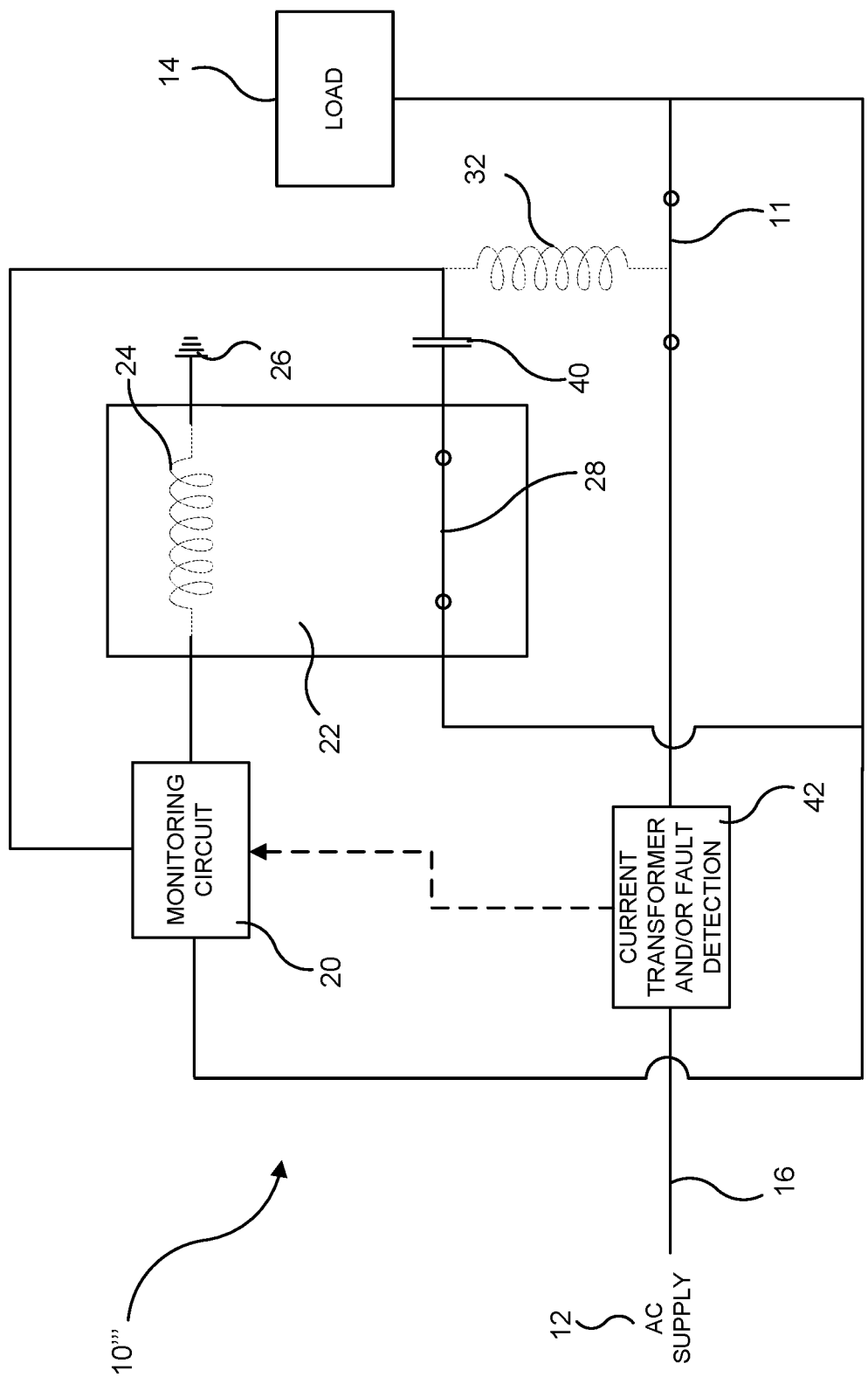

One configuration, as illustrated in FIGS. 12 and 13, employs construction of the trip coil (32) to require greater energy, or power, than it would momentarily experience prior to the switching circuit (28) of the normally-closed relay (22) being switched to its open (i.e., off) state when the breaker (10''') is either switched to its closed (i.e., on) state, or, alternatively, when the breaker (10''') is provided power while it is already in an unpowered, closed (i.e., on) state (i.e., during the very short period of time that the condition shown in FIGS. 13 and 15 exists). In this configuration, the trip coil (32) will be designed to require a greater magnetic force to activate its trip lever, or plunger, thereby requiring a greater sustained power input than it would momentarily experience.

The second configuration, as shown in FIGS. 14 and 15, employs a capacitive circuit (40) in the electrical feed from the switching circuit (28) of the normally-closed relay (22) to the trip coil (32). The capacitive circuit (40) momentarily absorbs enough energy to delay the power being fed to the trip coil (32) and prevent the trip coil (32) from experiencing enough current to trip the breaker (10'''). In this configuration, a typical trip coil (32) may be employed, or a trip coil (32) may be employed having characteristics similar to those described above in connection with FIGS. 12 and 13.

Figure 16:
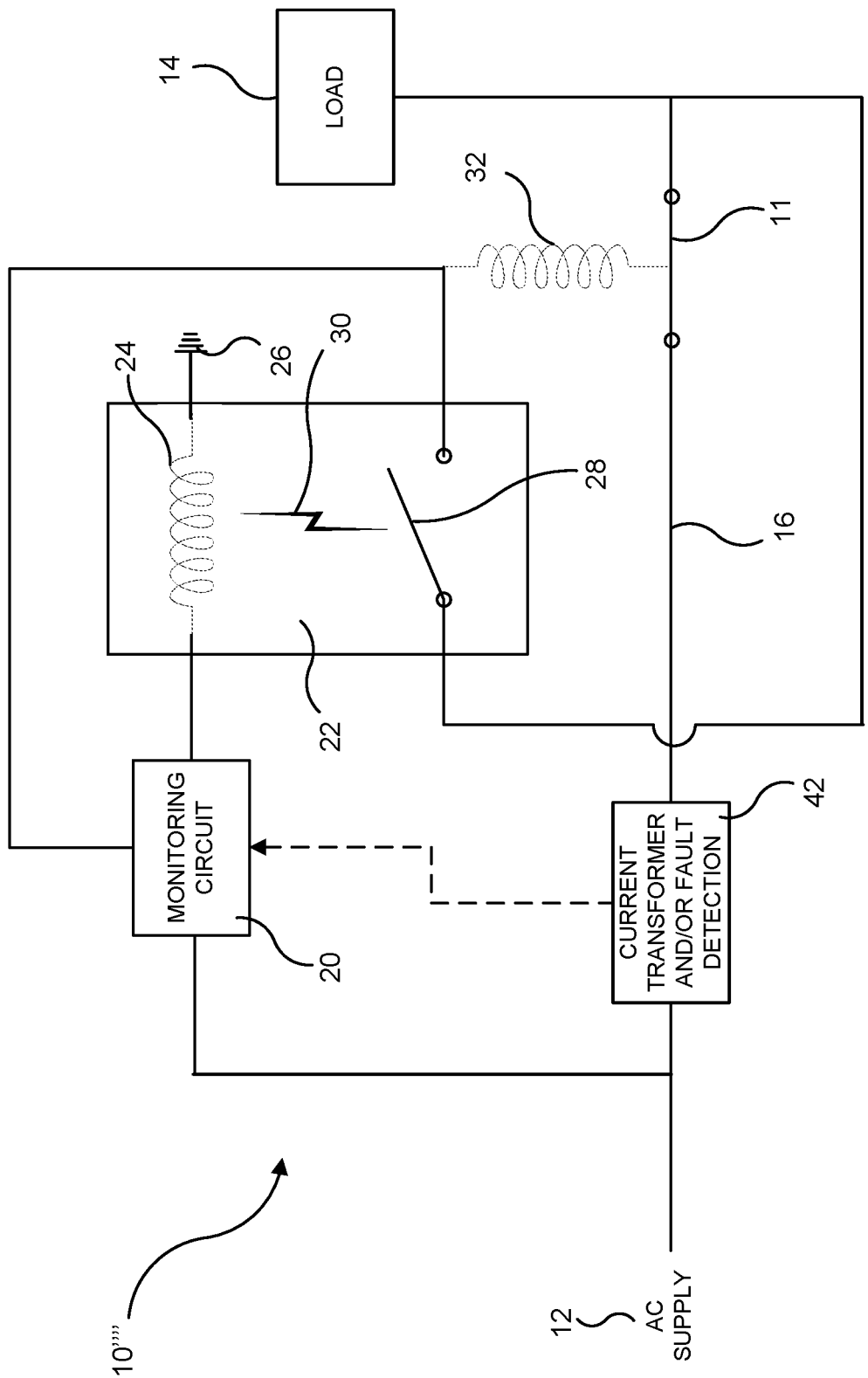
FIGS. 16 and 17 are schematic illustrations of an additional embodiment of a circuit breaker, which is similar to the circuit breaker shown in FIGS. 12 and 14, respectively, but with the monitoring circuit being supplied with power from the line side of the circuit breaker rather than the load side.
Figure 17:
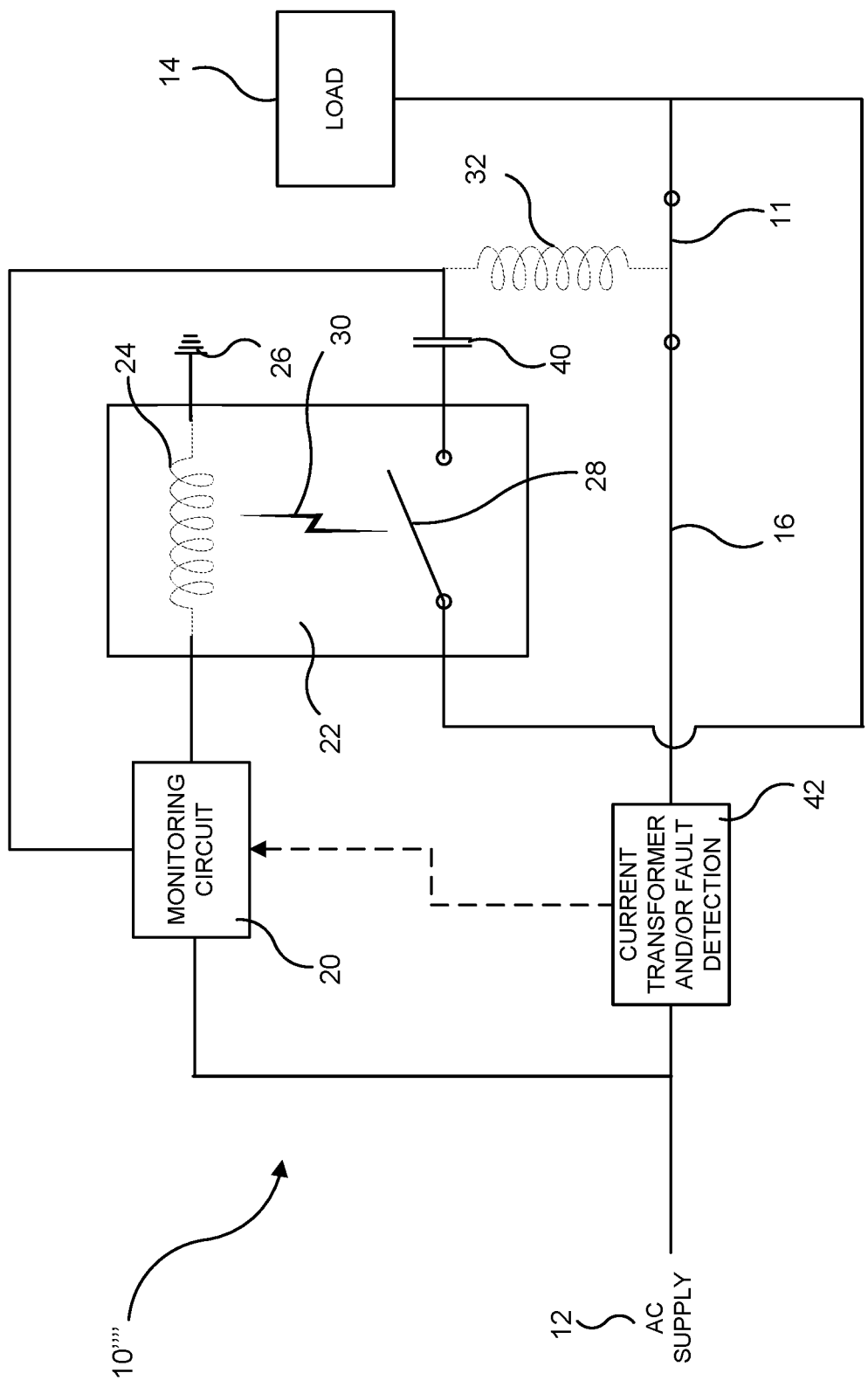

Turning now to FIGS. 16 and 17, a fifth exemplary embodiment of a circuit breaker (10'''') constructed in accordance with the present invention is shown. The circuit breaker (10'''') of FIGS. 16 and 17 is very similar to the circuit breakers (10'''') of FIGS. 12 and 14, respectively, except that the electronic monitoring circuit (20) of the circuit breaker (10'''') of FIGS. 16 and 17 is internally connected to the main power circuit (16) in the vicinity of the input line terminal of the breaker (10''''), i.e., upstream of the contacts (11).

Thus, in breaker (10'''') the monitoring circuit (20) is powered regardless of whether the contacts (11) are opened or closed, which means that the monitoring circuit (20) may be sending power to the activating circuit/coil (24) to thereby activate the switching circuit (28) to its open (i.e., off) state and disconnect power being fed to the trip coil (32), regardless of whether the contacts (11) are in their open (i.e., off) or closed (i.e., on) state. As such, there would be no concern with the trip coil (32) experiencing a short, momentary, input of power as the contacts (11) are moved from their open (i.e., off) state to their closed (i.e., on) state.

However, if power to the line input of the breaker (10'''') were interrupted with the contacts (11) in their closed (i.e., on) position, once power is restored, the contacts (11) would likely trip to their open (i.e., off) position since it would be likely the electronic circuitry would not restore power to the normally closed relay (22) fast enough to open the switching circuit (28) prior to the switching circuit (28) powering the trip coil (21) and tripping the contacts (11).

To prevent the trip coil (32) from tripping the breaker when power is restored while the breaker is already in its closed (i.e., on) position, two alternative configurations, or a combination of the two, are employed.

One configuration, as illustrated in FIG. 16, employs construction of the trip coil (32) to require greater energy, or power, than it would momentarily experience prior to the switching circuit (28) of the normally-closed relay (22) being switched to its open (i.e., off) state when the breaker (10'''') is provided power while it is already in an unpowered, closed (i.e., on) state. In this configuration, the trip coil (32) will be designed to require a greater magnetic force to activate its trip lever, or plunger, thereby requiring a greater sustained power input than it would momentarily experience. This is very similar to the configuration described above in connection with FIGS. 12 and 13.

The second configuration, as shown in FIG. 17, employs a capacitive circuit (40) in the electrical feed from the switching circuit (28) of the normally-closed relay (22) to the trip coil (32). The capacitive circuit (40) momentarily absorbs enough energy to delay the power being fed to the trip coil (32) and prevent the trip coil (32) from experiencing enough current to trip the breaker (10''''). This is very similar to the configuration described above in connection with FIGS. 14 and 15. In this configuration, a typical trip coil (32) may be employed, or a trip coil (32) may be employed having characteristics similar to those described above in connection with FIG. 16.

Although the invention has been described with reference to particular arrangement of parts, features, and the like, these are not intended to exhaust all possible arrangements or features, and indeed many modifications and variations will be ascertainable to those of skill in the art.

Additionally, various ancillary features may be provided as considered appropriate. For example, the breaker (10, 10', 10'', 10''', 10'''') may include a second trip solenoid, which, upon being powered, would insert a lever arm that would remain permanently in place to trip the breaker's trip link mechanism, whether the breaker was already in the "on" state or was in the process of being actuated. This lever arm would permanently prevent the trip link mechanism from being rearmed and would thus result in the breaker being permanently disabled. This feature may be optionally incorporated to provide an enhanced level of fail-safe operability by providing a level of protection against failure of the main trip coil powering the trip solenoid.

In this example, the electronic monitoring circuit would have an output to power this second coil, and would also have connections to the main trip coil to enable the processor to monitor the main trip coil. As the breaker (10, 10', 10'', 10''', 10'''') is actuated toward the "on" position, the processor would be activated and would immediately check the status of the main trip coil. Should the processor determine the main trip coil to be open, or faulty, the processor will send power to the second coil, thereby triggering the permanent placement of the second coil's trip lever arm to render the breaker permanently inoperable.

Alternately, or in addition, the breaker (10, 10', 10'', 10''', 10'''') may incorporate the capability (as may be enabled by Wi-Fi, Bluetooth, Zigbee, Z-Wave, and/or hard wiring to a central processor) to enable remote communication, thereby allowing remote monitoring, control, and/or programming.

The electronic circuit breaker (10, 10', 10'', 10''', 10'''') may be manufactured without the electronic control circuitry (20) being programmed for circuit protection. In this state, the circuit breaker (10, 10', 10'', 10''', 10'''') would provide no protection and would be kept inoperable, as the electronic control circuitry (20) would not provide any power to the normally-closed relay (22). Thus, if the breaker (10, 10', 10'', 10''', 10'''') were installed and actuated, it would trip prior to any current being supplied to any connected load.

In this state, the breaker (10, 10', 10'', 10''', 10'''') could be stocked un-programmed by the manufacturer or a retailer. The circuit breaker's electronic control circuitry (20) would require a high level security protection code to enable it to be programmed. A programming device could be provided that would enable selection of the desired circuit protection parameters, and, with the circuit breaker (10, 10', 10'', 10''', 10'''') properly connected to said device, the circuit breaker could be programmed with the desired protective parameters and labeled accordingly. This capability would tremendously reduce investment in inventory, as a single generic breaker would be able to be programmed to provide specific protection as selected from a large range of voltage and current ratings, inrush, ground-fault, arc-fault, and other protective attributes.

The present invention thus provides an electronically controlled circuit breaker that incorporates a mechanical contact mechanism while maximizing the fail-safe level of the breaker to insure its ability to provide the required circuit protection.

What is claimed is:

1. A circuit breaker comprising:
    a pair of main contacts movable with respect to each other between a closed position wherein a line terminal and a load terminal are in electrical communication with each other via a main power circuit, and an open position wherein the line terminal and the load terminal are electrically isolated from each other;
    a normally closed relay having a relay activating circuit and a switching circuit, the switching circuit defaulting to an on state, but being switchable to an off state when an activating power is supplied to the relay activating circuit, the switching circuit automatically returning to the on state when the activating power to the relay activating circuit is interrupted;
    wherein the switching circuit of said normally closed relay causes said pair of main contacts to be in the open position when the switching circuit is in the on state, thereby tripping said circuit breaker, but allows said pair of main contacts to be in the closed position when the switching circuit is in the off state, thereby allowing the line terminal and the load terminal to be in electrical communication with each other; and
    a monitoring circuit electrically connected to the relay activating circuit of said normally closed relay, said monitoring circuit supplying the activating power to the relay activating circuit so long as a determination is made that said circuit breaker is operating within acceptable parameters, and ceasing to supply the activating power to the relay activating circuit upon a determination being made that said circuit breaker is not operating within acceptable parameters, thereby tripping said circuit breaker.

2. The circuit breaker of claim 1 wherein said monitoring circuit receives power directly from a power supply supplying power to the line terminal, whereby whenever power is supplied to the line terminal, said monitoring circuit is powered on, and, when said monitoring circuit is operating properly, the activating power is supplied to the relay activating circuit.

3. The circuit breaker of claim 1 further comprising an internal switch selectively supplying power to said monitoring circuit, said internal switch being switched to an on state prior to said main contacts being closed so as to allow the monitoring circuit to supply the activating power to the relay activating circuit of said normally closed relay.

4. The circuit breaker of claim 3 wherein said internal switch also selectively supplies power to the switching circuit of said normally closed relay.

5. The circuit breaker of claim 1 further comprising a tripping mechanism connected to at least one of said pair of main contacts, said tripping mechanism causing said pair of main contacts to move from the closed position to the open position in response to a trip current received from the switching circuit of said normally closed relay when the switching circuit is in the on state, thereby tripping said circuit breaker.

6. The circuit breaker of claim 5 wherein said tripping mechanism comprises a trip coil.

7. The circuit breaker of claim 5 wherein said tripping mechanism requires greater energy, or power, to trip than the tripping mechanism momentarily experiences prior to the switching circuit of the normally closed relay being switched to its open state when the breaker is either switched to its closed state or when the breaker is first provided power while it is already in an unpowered, closed state.

8. The circuit breaker of claim 5 further comprising a capacitive circuit electrically connected between an output of the switching circuit of said normally closed relay and said tripping mechanism.

9. The circuit breaker of claim 1 wherein said normally closed relay comprises a solid state normally closed relay and wherein the relay activating circuit comprises a solid state activating circuit.

10. The circuit breaker of claim 1 wherein said normally closed relay comprises an electro-mechanical normally closed relay and wherein the relay activating circuit comprises an activating coil.

11. The circuit breaker of claim 1 wherein the determination is made that said circuit breaker is not operating within acceptable parameters upon detection of at least one of the following: an inrush current above a threshold level and an overcurrent above a threshold level.

12. The circuit breaker of claim 1 wherein the determination is made that said circuit breaker is not operating within acceptable parameters upon detection of at least one of the following: a ground fault condition and an arc fault condition.

13. A circuit breaker comprising:

a pair of main contacts movable with respect to each other between a closed position wherein a line terminal and a load terminal are in electrical communication with each other via a main power circuit, and an open position wherein the line terminal and the load terminal are electrically isolated from each other;

a normally closed relay having a relay activating circuit and a switching circuit, the switching circuit defaulting to an on state, but being switchable to an off state when an activating power is supplied to the relay activating circuit, the switching circuit automatically returning to the on state when the activating power to the relay activating circuit is interrupted;

wherein the switching circuit of said normally closed relay causes said pair of main contacts to be in the open position when the switching circuit is in the on state, thereby tripping said circuit breaker, but allows said pair of main contacts to be in the closed position when the switching circuit is in the off state, thereby allowing the line terminal and the load terminal to be in electrical communication with each other;

a tripping mechanism connected to at least one of said pair of main contacts, said tripping mechanism causing said pair of main contacts to move from the closed position to the open position in response to a trip current received from the switching circuit of said normally closed relay when the switching circuit is in the on state, thereby tripping said circuit breaker; and wherein said tripping mechanism requires greater energy, or power, to trip than the tripping mechanism momentarily experiences prior to the switching circuit of the normally closed relay being switched to its open state when the breaker is either switched to its closed state or when the breaker is first provided power while it is already in an unpowered, closed state.

* * * * *